(12) United States Patent
Nakamura et al.

(10) Patent No.: US 8,205,105 B2
(45) Date of Patent: Jun. 19, 2012

(54) ELECTRONIC DEVICE

(75) Inventors: Atsushi Nakamura, Tokyo (JP); Toru Hayashi, Tokyo (JP); Yuichi Mabuchi, Hitachi (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/023,491

(22) Filed: Feb. 8, 2011

(65) Prior Publication Data

US 2011/0126030 A1 May 26, 2011

Related U.S. Application Data

(63) Continuation of application No. 11/911,404, filed as application No. PCT/JP2005/007142 on Apr. 13, 2005, now Pat. No. 7,900,066.

(51) Int. Cl.
*G06F 1/00* (2006.01)
*H05K 1/03* (2006.01)
*H05K 9/00* (2006.01)
*H04B 3/28* (2006.01)

(52) U.S. Cl. ........... 713/300; 361/818; 333/12; 174/255

(58) Field of Classification Search .................. 713/300; 361/818; 333/12; 174/255
See application file for complete search history.

(56) References Cited

U.S. PATENT DOCUMENTS

| 5,962,984 | A  | * | 10/1999 | Mashburn et al. | ........ 315/200 A |
| 6,075,211 | A  |   | 6/2000  | Tohya et al. | |
| 6,745,268 | B1 | * | 6/2004  | Greeff et al. | .................. 710/100 |
| 2006/0028704 | A1 | * | 2/2006 | Inoue et al. | .................. 359/237 |
| 2008/0023824 | A1 | * | 1/2008 | Salzman | ........................ 257/724 |

FOREIGN PATENT DOCUMENTS

| JP | 09-139573 | 5/1997 |
| JP | 10-223997 | 8/1998 |
| JP | 2000-349443 | 12/2000 |
| JP | 2001-267702 | 9/2001 |
| JP | 2002-57422 | 2/2002 |
| JP | 2003-297963 | 10/2003 |

* cited by examiner

*Primary Examiner* — Mark Connolly
(74) *Attorney, Agent, or Firm* — Mattingly & Malur, PC

(57) ABSTRACT

An electronic device comprising: a wiring substrate having a first power-supply wiring to which a first power-supply potential is applied and a second power-supply wiring to which a second power-supply potential lower than the first power-supply potential is applied; a microcomputer having first and second power-supply terminals in which the first power-supply terminal is connected to the first power-supply wiring and the second power-supply terminal is connected to the second power-supply wiring; and a connector connected to the first and second power-supply wirings, wherein an inductor element for correcting an impedance error of the first and second wirings is connected in series to either one of the first and second power-supply wirings. According to such configuration, unnecessary electromagnetic radiation posed by a common current can be suppressed.

9 Claims, 37 Drawing Sheets

32MHz

48MHz

64MHz

80MHz

96MHz

112MHz

32MHz

64MHz

96MHz

128MHz

FIG. 37A 48MHz
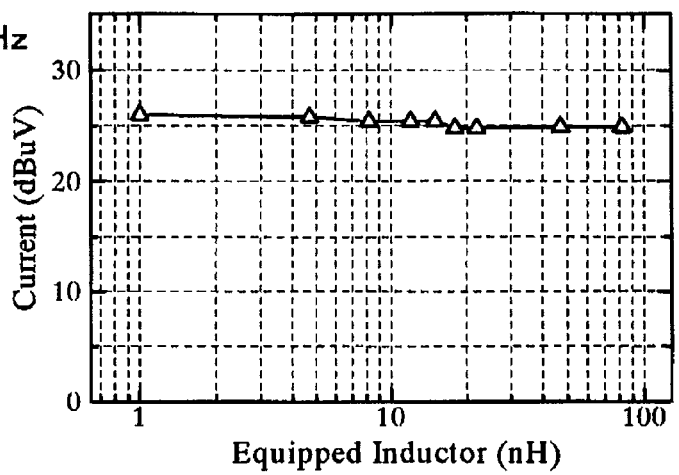
FIG. 37B 80MHz
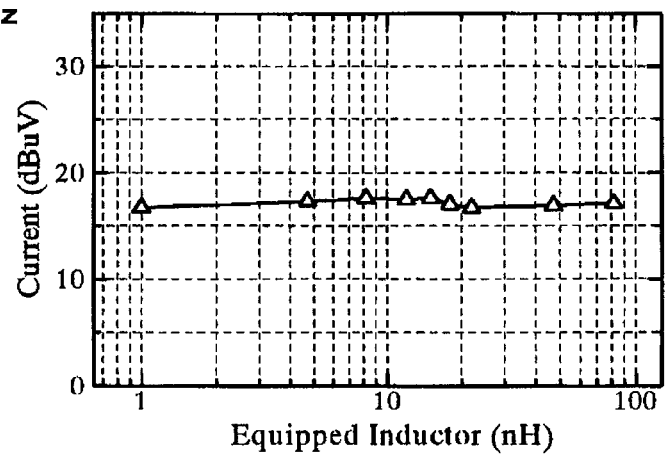
FIG. 37C 112MHz
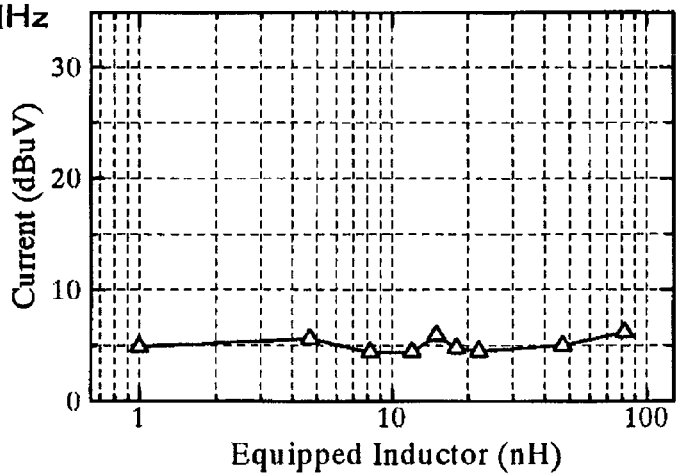

CURRENT DRIVEN TYPE

VOLTAGE DRIVEN TYPE

ELECTRONIC DEVICE

This is a continuation application of U.S. application Ser. No. 11/911,404, filed Oct. 12, 2007, now allowed, which is a 371 of International Application NO. PCT/JP2005/007142, filed Apr. 13, 2005, the contents of which are hereby incorporated by reference into this application.

TECHNICAL FIELD

The present invention relates to an electronic device, more particularly, to a technique effectively applied to an electronic device in which a microcomputer is mounted on a wiring substrate thereof as an electronic part.

BACKGROUND ART

Along with the advanced computerization and multimedia trends in the society and needs for high functions to information processors, high-speed devices including LSI (Large Scale Integrated Circuit) and memories whose operating frequency exceeds several GHz have been developed continuously. Further, electronic devices have become more compact, and these high-speed devices are packaged in electronic devices at high density. Along with the trends toward high-speed and downsizing, electric noise such as conduction and unnecessary electromagnetic radiation from electronic devices tend to become of high level and high bandwidth. These electric noises not merely cause malfunction in their own circuits, but also cause adverse effects to other electronic devices including misoperation and jamming in receiving broadcasting radio waves. Accordingly, it has been an important subject to develop products with few electric noises such as conduction or unnecessary electromagnetic radiation from devices.

Currently, with regard to the noise countermeasures of electronic devices, since it has been difficult to clarify the relation between circuit operations and noise occurrence, efforts have been made through stopgap-measure like countermeasures after completion of products with conspicuous noise problems, and product designs to take large margins to noises. However, along with the increased noise level in high-speed and high-density electronic devices, increased time and costs in noise countermeasures by the stopgap-measure like countermeasures after completion of products have come to unignorable. Further, by the product designs to take large margins to noises, it has become difficult to satisfy the requirements for compact product size and low costs. Under such circumstances, movements have become active regarding problems of the EMC (Electromagnetic Compatibility) and EMI (Electromagnetic Interference) as design problems, and starting the approach against them from the initial stage of product developments. This is to clarify the cause of noise occurrence in electronic devices and perform product designs at a more essential level in consideration of countermeasures against noises.

Meanwhile, the inventors of the present invention have searched prior art documents about the unnecessary electromagnetic radiation countermeasure technologies, on the basis of the result of the present invention. As a result, the following documents were extracted.

In Japanese Patent Application Laid-Open Publication No. H10-223997, a technology is disclosed where "in a printed-wiring substrate, to a power-supply pattern of an IC separated from a main power supply, a ground pattern is formed on a back surface of the substrate so as to oppose the power-supply pattern, so that electromagnetic wave radiation noises from the printed-wiring substrate are reduced."

In Japanese Patent Application Laid-Open Publication No. 2003-297963, a technology is disclosed where "in a multi-layer circuit substrate comprising: a layer to mount an IC; a layer including a power-supply pattern for an external power supply to which an external power supply is connected; and a layer including a power-supply wiring and a ground wiring to which both the terminals of a bypass capacitor to an IC power-supply terminal are connected on the surface opposite to the layer to mount an IC, wherein the power-supply pattern for IC power-supply terminal to which the IC power-supply terminal is connected in any layer is arranged so as to be spatially separate from the power-supply pattern for external power supply; the power-supply pattern for external power supply is connected to the power-supply wiring for the bypass capacitor; and the power-supply wiring for the bypass capacitor is connected to the power-supply pattern for the IC power-supply terminal so that unnecessary radiation noises that occurs due to high frequency current occurring at the IC power-supply terminal transmits from the power-supply pattern for external power supply to the entire substrate are reduced."

In Japanese Patent Application Laid-Open Publication No. 2001-267702, a technology is disclosed where "in a printed-wiring substrate comprising a plurality of layers including: a layer including a mounting surface onto which semiconductor parts having a plurality of input power-supply terminals to input identical voltage are equipped; and a layer including a first power-supply area to which an external power supply is connected, wherein a second power-supply area whose outside dimension is smaller than the outside dimension of the semiconductor parts arranged independently from the first power-supply area and supplies electric power to the plurality of input power-supply terminals via a filter portion to reduce noises from the first power-supply area is arranged, thereby reducing noise components at the low frequency side supplied from the external, and also radiation noise itself at the high frequency side radiated from the second power-supply area itself can be suppressed to be small, and radiation noises can be reduced to be very small as a whole."

Patent Document 1: Japanese Patent Application Laid-Open Publication No. H10-223997

Patent Document 2: Japanese Patent Application Laid-Open Publication No. 2003-297963

Patent Document 3: Japanese Patent Application Laid-Open Publication No. 2001-267702

DISCLOSURE OF THE INVENTION

In recent years, in automobiles, many parts are being computerized. For example, to air bags, brake, engine, air conditioner, and various indicators, exclusive control electronic devices are mounted. Further, communication devices such as radio, audio components, television, and car navigation system are also mounted. In this manner, from the increased number of in-vehicle electronic devices, and needs for high-speed control and high-speed processing of a large amount of data, many high-speed microcomputers are employed.

When electronic devices loaded on vehicles operate, unintended radio waves are radiated from their printed-circuit substrates and power-supply cables (radiation noises). Due to these radiation noises, reception of radio broadcasting radio waves by on-vehicle antenna is jammed, it is so-called radio noises which has been a serious problem.

Currently, in evaluation test after trial production of products, stopgap measure like techniques to take countermeasures after radio noise problems become obvious have been used generally. However, along with the high-speed of microcomputer's operating frequency in recent years, the radiation noises from in-vehicle electronic devices tend to become high level and high bandwidth. Therefore, by the conventional stopgap measure like countermeasures, sufficient noise countermeasure effects cannot be attained, and there increased cases which necessitates drastic design changes and increased number of noise countermeasure parts.

Under such circumstances, there is a strong demand for the development of EMC (Electro Magnetic Compatibility) design technology in the initial stage of product developments.

Accordingly, the inventors of the present invention have studied the radio noise problem in in-vehicle electronic devices, from the viewpoints of conducted noise where current flows through electronic device inside and harness as noise and radiation noise. As a result, the inventors of the present invention have found that unnecessary electromagnetic radiation occurs by common current flowing through harness. Hereinafter, the correlation between common current flowing through harness with the same phase and unnecessary electromagnetic radiation is explained.

FIG. 10 shows unnecessary electromagnetic wave radiation from an electronic device loading a microcomputer.

In FIG. 10, in the inside of a microcomputer 21, due to high speed switching and the like of CMOS (Complementary Metal Oxide Semiconductor), noise current having higher frequency component than operating frequency occurs. This noise current transmits to a printed-circuit substrate 20 and a harness 22 (conducted noise 23), and propagates to space as radiation noise 24. At this moment, in consideration of the fact that the wavelength of electromagnetic wave radiated in the frequency band (FM band: 79 to 90 MHz) that becomes a problem of radio noise is approximately 3.3 to 4.0 m, it can be seen that the harness (1 to 2 m) 22 attached for the purpose of sending and receiving signals and supplying electric power to the printed-circuit substrate 20 mainly works as an antenna.

In the harness 22, noise current that flows through the power supply line (or signal line) and the GND line in reverse direction to each other (differential mode current), and noise currents that flow in the same direction to each other (common mode current) exist at the same time. This relation is shown in FIG. 11 (a figure showing a mechanism of unnecessary electromagnetic radiation occurrence from electronic device).

In consideration of electromagnetic wave radiation from the harness 22, there are: (1) one arising from the differential mode current; and (2) one arising from the common mode current.

When the length of the harness 22 is defined as 1, and the distance between the power-supply/GND lines is defined as d, the radiation electric field arising from (1) differential mode current of the harness 22 is expressed by the following equation at maximum.

$$E_{diff}=1.32\times10^{-14}\times f^2\times l d\times I\times 1/r \text{ (V/m)} \quad (1)$$

Herein, f indicates frequency, I indicates the absolute value of current flowing through the harness, and r indicates the distance from antenna.

In the same manner, the radiation electric field arising from (2) common mode current is expressed by the following equation at maximum when the harness is taken as a monopole antenna.

$$E_{comm}=1.26\times10^{-6}\times f\times l\times I\times 1/r \text{ (V/m)} \quad (2)$$

For example, in the case where the same amounts of (1) differential mode current and (2) common mode current flow through the harness 22 whose wire distance (d) is 1 mm, at 90 MHz (FM band), $E_{comm}/E_{diff}=1.06\times10^3$, and it can be understood that (2) common mode current has a better radiation efficiency by approximately 1000 times (60 dB).

In actual in-vehicle electronic devices, the relation between the radiation electric field amount from the harness 22 and the common mode current has been measured. The result is shown in FIG. 12 (a figure showing actual measurement values of common mode current and radiation noise amount). In FIG. 12, FIG. 12A shows the case of 32 MHz, FIG. 12B shows the case of 48 MHz, FIG. 12C shows the case of 64 MHz, FIG. 12D shows the case of 80 MHz, FIG. 12E shows the case of 96 MHz, and FIG. 12F shows the case of 112 MHz.

From FIG. 12, it is known that in either one of frequencies (FIGS. 12A, 12B, 12C, 12D, 12E, 12F), the common mode current is proportional to the radiation electric field amount by 1:1, and it is found that the main cause of radiation noise 24 is the common mode current flowing through the harness 22. Hereinafter, a mechanism of the common mode current occurrence of the printed-circuit substrate loading a microcomputer is described.

In the printed-circuit substrate 20 loading a microcomputer 21, there are mainly two kinds of causes of common mode current occurrence. One is called Current Driven Type, which occurs on the wiring on the printed-circuit substrate 20, in particular at the portion where differential mode noise current flows much. In the wiring where differential mode noise current flows (mainly high speed signal line and power-supply/GND wirings), if there is a portion where the impedance balance is bad, unconsidered reflection of noise current and the like occur at the point, and common mode current occurs.

The other is called Voltage Driven Type, which occurs on the wire on the printed-circuit substrate 20, and at the portion where potential fluctuation is large. By the electric field coupling at the portions where potential fluctuation is large such as oscillation circuit and high speed signal output pin and the like and other portions, unconsidered potential fluctuation is induced, as a result, common mode current occurs.

Microcomputers of single chip type frequently used in in-vehicle electronic devices rarely send/receive signals at high speed with external circuits. Therefore, Current Driven Type common mode current occurs mainly in power-supply/GND wirings as shown in FIG. 40A. Most of noise current flowing through the power-supply/GND wirings occurs by switching operation of Clock Pulse Generator (CPG) in the microcomputer. CPG performs two times of switching by one clock, and at the same time, through current flows through the power-supply/GND wirings. Therefore, Current Driven Type common mode current becomes a spectrum having a peak in a higher harmonic of an even-number multiple clock frequency.

Meanwhile, most of Voltage Driven Type common mode current occurs mainly in an oscillation circuit part as shown in FIG. 40B. The oscillation circuit always repeats potential fluctuation at a frequency to become the standard of microcomputer operations. By the electric field coupling of the potential fluctuation portion and other portions (power-supply/GND wirings, harness and the like), unconsidered potential fluctuation is induced, and as a result, common mode current occurs. In the oscillation circuit, a sine wave of standard oscillation oscillates in slightly deformed waveform. Accordingly, Voltage Driven Type common mode current becomes a spectrum having a peak in a higher harmonic of an odd-number multiplied clock frequency.

Next, with regard to the two mechanisms of common mode current occurrence mentioned above, the results of evaluation by an analysis and an actual measurement are explained hereinafter.

In the examinations of mechanisms of common mode current occurrence of an electronic device loading a microcomputer, PEEC (Partial Element Equivalent Circuit) method is employed. The PEEC method is one where a wiring of a printed-circuit substrate as objective is divided into minute portions called Unit Cells, and electric characteristics (L, R, G, C) of the respective Unit Cells are obtained, and they are all combined and an equivalence of the whole is derived. Equivalent circuit derived by this method may be easily assembled into the general purpose circuit analysis software SPICE and the like. Therefore various electric characteristics can be evaluated.

In the modeling this time, wirings of a printed-circuit substrate formed of two layers is divided into Capacitive Cells, and two Inductive Cells consisting of x axis direction and y axis direction. From the Capacitive Cell, the capacity C and the dielectric loss G between both planes are derived. Further, from the Inductance Cell, the inductance L in x axis direction and y axis direction, coupling coefficient K, resistance R are derived. When the lengths in x axis direction and y axis direction in respective Cells are defined as $l_x$, $l_y$, C and G, L, K, R are obtained by the following equation.

$$C_{12} = \in_r \in l_x l_y/d (F) \quad (3)$$

$$C_{10} = C_{12} \times 1/10 (F) \quad (4)$$

$$C_{20} = C_{12} \times 1/10 (F) \quad (5)$$

$$G = 1.0 \times 10^8 (\Omega) \quad (6)$$

$$L_x = \mu \times l_x/l_y (H) \quad (7)$$

$$L_y = \mu \times l_x/l_y (H) \quad (8)$$

$$K = 0.593 \text{ (for } d = 1.6 \text{ mm)} \quad (9)$$

$$R_x = 1.0 \times 10^{-3} \times l_x (\Omega) \quad (10)$$

$$R_y = 1.0 \times 10^{-3} \times l_y (\Omega) \quad (11)$$

Herein, $\in_r$, $\in$, $\mu$, d indicates relative permittivity, vacuum permittivity, magnetic permeability, and distance between layers, respectively. Further, $C_{12}$ indicates the capacitance between both planes, $C_{10}$, $C_{20}$ indicate capacitances of the upper layer and the lower layer to absolute GND, respectively. In the evaluation this time, fixed values are used for the dielectric loss G and the resistance R. Originally, the resistance changes according to the frequency due to skin effect. However, in the frequency area (FM band) to become problematic, a reactance component of the inductance L is larger than the resistance and accordingly it is considered that it does not cause any problem even if skin effect is not taken into consideration. Furthermore, in the model this time, the capacitances ($C_{10}$, $C_{20}$) of Capacitive Cells of respective layers to absolute GND are also taken into consideration. This value is made 1/10 of the interlayer capacitance $C_{12}$. The conceptual figure of modeling this time is shown in FIG. 13 (a conceptual figure of modeling printed-circuit substrate in the PEEC method). Further, in the evaluation of common mode current, the circuit analysis software SPICE is employed.

Next, by use of the analysis technology by the PEEC method explained previously, the respective mechanisms of common mode current occurrence of (1) Current Driven Type and (2) voltage Driven Type in a substrate loading a microcomputer are verified.

(1) Current Driven Type Common Mode Current

A printed-circuit substrate model and a harness model used in the evaluation are shown in FIG. 14 (FIG. 14A shows a power-supply wiring of a first layer, FIG. 14B shows a GND wiring of a second layer, FIG. 14C shows the whole image of the model).

The printed-circuit substrate is a model to be sized in the range of 10 cm×10 cm, on the assumption of actual in-vehicle electronic device, and the distance between layers is 1.6 mm. Further, the size of the Unit Cell is 2.5 mm×2.5 mm. The first layer of the printed-circuit substrate is the power-supply wiring 26, and the second layer is the GND wiring 27. In particular, in the GND wiring 27 of the second layer, a loop shaped unbalance portion 27a is arranged, and a common mode current occurrence by an influence from this is evaluated.

As a CPG model in the microcomputer, a model structured of two variable resistors is employed. This circuit structure and switching characteristics are shown in FIG. 15 (FIG. 15A shows the CPG driver model, FIG. 15B shows CPG switching characteristics). From FIG. 15B, since there exists a period between $1.0 \times 10^{-9}$ sec to $2.0 \times 10^{-9}$ sec where the upper and lower variable resistance values of the CPG simultaneously become small, a through-current flows between the CPG power supply and the GND. Further, at the vicinity of the connector 25 on the printed-circuit substrate, a bypass capacitor is equipped. A length of the harness 22 to be connected to the printed-circuit substrate is 30 mm, and at the position 2.5 mm from the connector 25 (current evaluation position P1 in FIG. 14C), the common mode current is evaluated.

Meanwhile, for simplification of the analysis, the harness 22 also uses the same Unit Cell model as in the printed-circuit substrate. An equivalent circuit approximate to the present evaluation model is shown in FIG. 16 (a figure showing an approximate equivalent circuit of the Current Driven Type common mode current evaluation).

In FIG. 17 (a figure showing the time change of current distribution of the analysis model), a noise current distribution after the CPG switching from $1.365 \times 10^{-9}$ sec to $2.124 \times 10^{-9}$ sec is shown. In FIG. 17, FIG. 17A shows the noise current distribution at $1.365 \times 10^{-9}$ sec, FIG. 17B shows the current distribution at $1.627 \times 10^{-9}$ sec, FIG. 17C shows the noise current distribution at $1.827 \times 10^{-9}$ sec, and FIG. 17D shows the noise current distribution at $2.124 \times 10^{-9}$ sec. Meanwhile, the transition in the z axial direction in the respective current distributions shows the absolute value of current.

Further, FIG. 18 (figures showing time changes of respective currents at the current evaluation position) is a graph showing time changes of respective currents of differential mode and common mode at the current evaluation point P1.

From FIG. 17, it is shown that noise current that occurs by switching of the CPG transmits on the printed-circuit substrate to the harness 22. Further, due to the reflection by the loop-shaped unbalance portion 27a in the GND wiring 27, there occurs a phase difference with noise current flowing through the power-supply wiring 26, and this becomes the common mode current.

For comparison, with respect to the printed-circuit substrate, a model without the impedance unbalance portion 27a in the GND wiring 27 of the second layer is also evaluated. This model is shown in FIG. 19 (FIG. 19A shows the power-supply wiring of the first layer, FIG. 19B shows the GND wiring of the second layer, FIG. 19C shows the whole image of the model). The model shown in FIG. 19 is a model where only the unbalance portion 27a is removed from the wiring having the unbalance portion 27a in the GND wiring 27 which was evaluated previously, and the GND wiring 27 has a shape completely symmetrical to the power-supply wiring 26. The interlayer distance and the size of the Unit Cell, and model parameters of CPG model, capacitor mounting position, and length of the harness 22 and the like are same value as those in the model having the unbalance portion 27a in the GND wiring 27 which was evaluated previously. The evaluation results of common mode current using this model are shown in FIG. 20 (figures showing time changes of the current distribution of the analysis model) and FIG. 21 (a figure showing a time change of each current at current evaluation position). FIG. 20 shows the current portion from $1.406 \times 10^{-9}$ sec to $2.779 \times 10^{-9}$ sec after the CPG switching. In FIG. 20, FIG. 20A shows a noise current distribution at $1.406 \times 10^{-9}$ sec, FIG. 20B shows a noise current distribution at $1.716 \times 10^{-9}$ sec, FIG. 20C shows a noise current distribution at $2.407 \times 10^{-9}$ sec, and FIG. 20D shows a noise current portion at $2.779 \times 10^{-9}$ sec.

In addition, FIG. 21 shows time changes of respective amounts of current of differential and common modes at the current evaluation point P1.

From FIG. 20 and FIG. 21, it is shown that the noise current occurring by the CPG switching transmits from the printed-circuit substrate to the harness 22, but since there is not the unbalance portion 27a in the GND wiring 27, there is no phase difference in noise current due to reflection or the like. As a result, there occurs no common mode current. From the above evaluation, it is found that the common mode current occurs by the impedance unbalance in the GND wiring 27 (or the power-supply wiring 26) on the printed-circuit substrate.

(2) Voltage Driven Type Common Mode Current

In FIG. 22 (FIG. 22A shows the power supply layer of first layer, FIG. 22B shows the GND layer of second layer, FIG. 22C shows the whole image of the model), the evaluation model used in examinations of the mechanism of occurrence of the Voltage Driven type common mode current is shown. This model is also a model to be sized within the range of 10 cm×10 cm, on the assumption of actual in-vehicle electronic devices, and the interlayer distance is 1.6 mm. Further, the size of the Unit Cell is 4.0 cm×4.0 cm. The first layer of the printed-circuit substrate is a power supply layer (power-supply wiring 26), and the second layer is a GND layer. The GND layer 29 is of a plane structure of 10 cm×10 cm, and on a part of the first layer, a pattern simulating the wiring of an oscillation circuit 30 (oscillation circuit pattern 31) is arranged. Further, at the vicinity of the connector 25 on the printed-circuit substrate, a bypass capacitor (capacitor C) is equipped. The occurrence of the common mode current at the moment when a part of this oscillation circuit pattern 31 is excited by a voltage source 32 is evaluated by an analysis. An approximate equivalent circuit to this evaluation model is shown in FIG. 23 (a figure showing an approximate equivalent circuit of the evaluation of the Voltage Driven Type common mode current).

In FIG. 24, noise current distributions from $1.406 \times 10^{-9}$ sec to $2.779 \times 10^{-9}$ sec at the moment when the oscillation circuit pattern portion is excited by the voltage source 32 are shown. In FIG. 24, FIG. 24A shows a noise current distribution at $1.406 \times 10^{-9}$ sec, FIG. 24B shows a noise current distribution at $1.716 \times 10^{-9}$ sec, FIG. 24C shows a noise current distribution at $2.407 \times 10^{-9}$ sec, and FIG. 24D shows a noise current portion at $2.779 \times 10^{-9}$ sec. Meanwhile, the transition in the z axis direction in each current distribution in FIG. 24 shows the absolute value of current.

Further, in FIG. 25 (a figure showing time change of each current at the current evaluation position), a graph of time change of each current of differential and common modes at the current evaluation point is shown.

From FIG. 24 and FIG. 25, it is shown that the common mode current occurs by potential fluctuation due to the electric field coupling between the pattern excited by the voltage source and other power-supply/GND wirings, and this current transmits to the harness 22. By this evaluation, it is found that the common mode current occurs due to the potential fluctuation of oscillation circuit and the like.

Next, the analysis results evaluated previously and actual measurement results using the evaluation substrate are compared.

In FIG. 26, the evaluation substrate used in the measurement this time is shown. In FIG. 26, FIG. 26A is a plan view showing a main surface side of the evaluation substrate, and FIG. 26B is a plan view showing the back surface side of the opposite side of the main surface of the evaluation substrate. The evaluation substrate 20a is a two-layer substrate of 50 mm×50 mm size, and a thickness of the dielectric is 1.6 mm, and the relative permittivity is 4.7, and a thickness of conductor is 35 μm. On the first layer of this substrate, a microcomputer 21 and a crystal oscillator 33 which is an oscillation circuit are mounted. The crystal oscillator oscillates at 16 MHz, and this becomes the operating frequency of the microcomputer 21. Further, in the power-supply/GND wirings (26/27) to the connector 25, loop-shaped unbalance wirings (26a/27a) are formed. This unbalance wiring is structured so as to be optionally added to only the power supply side/only the GND side according to cutting of pattern to be connected. Further, the second layer comprises a pad for mounting a capacitor and an inductance.

In the measurement, the harness for electric power supply has a parallel two-line structure of 150 mm, and this end is connected via LISN (pseudo power supply circuit) to power supply. Further, at the position 50 mm away from the evaluation substrate 20a, a current probe is arranged, and by a spectrum analyzer connected thereto, the common mode current is measured. Meanwhile, in current measurement results, correction is not made specially, and the measurement values by spectrum analyzer are used.

[1]; Measurement Results of the Current Driven Type Common Mode Current

Herein, measurement results of the common mode current which occurs in Current Driven Type are described. As for evaluation conditions, in the evaluation substrate 20a shown in FIG. 26, capacitor C is equipped at the vicinity of connector 25, and inductor mounting pad is short-circuited. At this moment, common mode current in the case when (1) the unbalance pattern is added to only the power-supply wiring, (2) the unbalance pattern is added to only the GND wiring, (3) the unbalance pattern is added to the power supply and GND wirings is measured, and the results are compared with the measurement results in the case when unbalance pattern is not added to any of power-supply/GND wirings.

In FIG. 27, the measurement results in the case when (1) the unbalance pattern is added to only the power-supply wiring is shown. From FIG. 27, at a four times higher harmonic of the microcomputer operation frequency 16 MHz (64 MHz) and a six times higher harmonic (96 MHz), the common mode current increases by 7.2 dB, 2.0 dB respectively. Meanwhile, at five times higher harmonic of the microcomputer operating frequency (80 MHz), on the contrary, the common mode current decreases by 1.8 dB.

In FIG. 28, the measurement results in the case when (2) the unbalance pattern is added to only the GND wiring is shown. From FIG. 28, in the same manner as in the above case (1), at the four times higher harmonic of the microcomputer operating frequency (64 MHz) and the six times higher harmonic (96 MHz), the common mode current increases by 18.5 dB, 11.1 dB, respectively. On the other hand, at the five times higher harmonic of the microcomputer operating frequency (80 MHz), the increase is 2.5 dB, which is smaller than the former.

In FIG. 29, the measurement results in the case when (3) the unbalance pattern is added to both the power supply and GND wirings is shown. From FIG. 29, in the same manner as in the above cases (1) and (2), at the four times higher harmonic of the microcomputer operating frequency (64 MHz) and the six times higher harmonic (96 MHz), the common mode noise increases by 12.6 dB, 7.5 dB, respectively. On the other hand, at the five times higher harmonic of the microcomputer operating frequency (80 MHz), the increase is 1.1 dB, which is smaller than the former.

From the above measurement results, it is shown that when there is the unbalance pattern in the power supply or GND (or either thereof) wiring, the common mode current occurs at an even-number times higher harmonic of the microcomputer operating frequency (64 MHz, 96 MHz). This coincides with the tendency of the previous analysis results of the Current Driven Type common mode current.

[2] Measurement Results of the Voltage Driven Type Common Mode Current

Herein, the measurement results of common mode current that occurs in Voltage Driven Type are described. In a substrate loading a microcomputer, the crystal oscillator 33 is equipped for generating an operating clock of the microcomputer. In this crystal oscillator 33, the potential always fluctuates at a specified frequency, and by electric field coupling between this part and other wiring patterns (power-supply/GND wirings and the like), an unconsidered potential fluctuation is induced, and as a result, the common mode current occurs.

Therefore, on the evaluation substrate, a metal cover of the crystal oscillator 33 is connected to the nearest GND pattern and sealed, and the change of occurrence amount of the common mode current is evaluated by a measurement.

The measurement results are shown in FIG. 30. From FIG. 30, at five times higher harmonic of the microcomputer operating frequency 16 MHz (80 MHz), common mode current decreases by 16.9 dB. On the other hand, at the four times higher harmonic and the six times higher harmonic of the microcomputer operating frequency (64 MHz, 96 MHz), the decrease amounts of common mode current are 2.7 dB, 7.0 dB, which are smaller than that at the five times higher harmonic.

From the above results, it is shown that, because of potential fluctuation in the crystal oscillator 33, the common mode current occurs at an odd-number-fold higher harmonic of the microcomputer operating frequency (80 MHz). This coincides with the tendency of the previous analysis results of the Voltage Driven Type common mode current.

As described above, according to the study by the inventors of the present invention, it has been found that the common mode current occurs by unbalance of impedance in power-supply/GND wirings, and under the influence of this common mode current, unnecessary electromagnetic radiation occurs.

Accordingly, the inventors of the present invention have put attention onto the unbalance of impedance in power-supply/GND wirings and made the present invention.

The object of the present invention is to provide a technique capable of reducing the common mode current and controlling the unnecessary electromagnetic radiation.

The above and other objects and novel characteristics of the present invention will be apparent from the description of this specification and the accompanying drawings.

The typical ones of the inventions disclosed in this application will be briefly described as follows.

The above object is achieved, from a microcomputer to become a noise source to a package to which a chip is mounted, further, on a printed-circuit substrate to which a package is mounted, by packaging an inductor element in combination with a capacitor for controlling the balance of power-supply/GND wirings from a power-supply terminal of microcomputer to a connector. For example, there is provided the following.

An electronic device comprising:
  a wiring substrate having a first power-supply wiring to which a first power-supply potential is applied and a second power-supply wiring to which a second power-supply potential lower than the first power-supply potential is applied;
  a microcomputer having first and second power-supply terminals in which the first power-supply terminal is connected to the first power-supply wiring and the second power-supply terminal is connected to the second power-supply wiring;
  a connector connected to the first and second power-supply wirings; and
  a bypass capacitor connected in parallel to the first and second power-supply wirings,
  wherein, in between the power-supply terminal of the microcomputer and the bypass capacitor, an inductor element for correcting an impedance error of the first and second wirings is connected in series to either one of the first and second power-supply wirings.

According to the means mentioned above, it is possible to reduce the common mode current at a harness connected to a connector and control the unnecessary electromagnetic radiation.

The effects obtained by typical aspects of the present invention will be briefly described below.

It is possible to reduce the common mode current and control the unnecessary electromagnetic radiation.

BRIEF DESCRIPTIONS OF THE DRAWINGS

FIGS. 37A-37C are diagrams concerning unnecessary electromagnetic radiation which the inventors of the present invention have studied showing the measurement results of common mode current (odd-number-fold higher harmonic) with mounting the chip inductor;

Figure 38A:
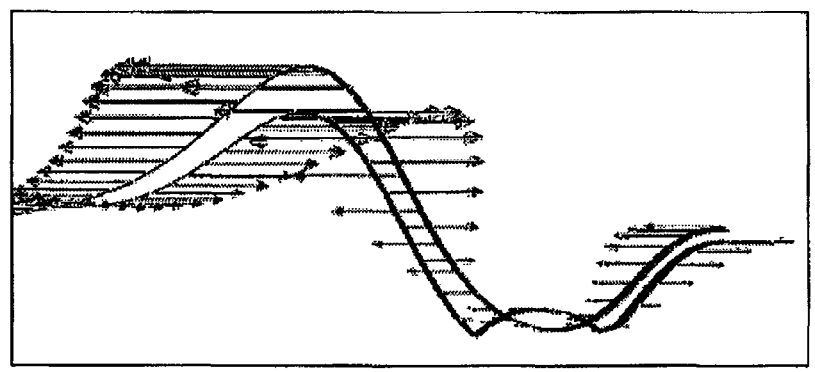
Figure 38B:
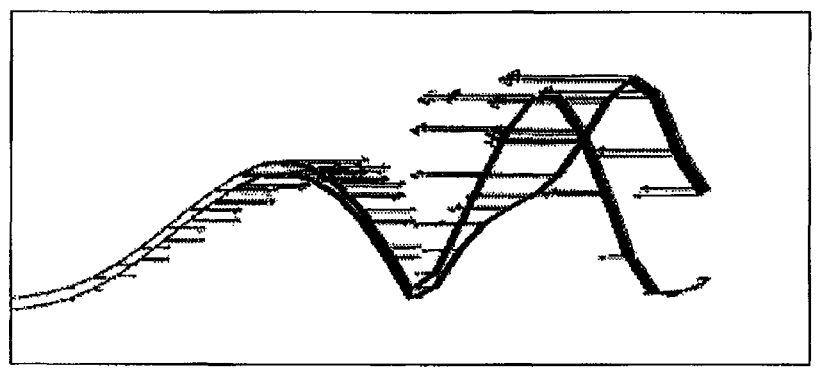
Figure 39A:
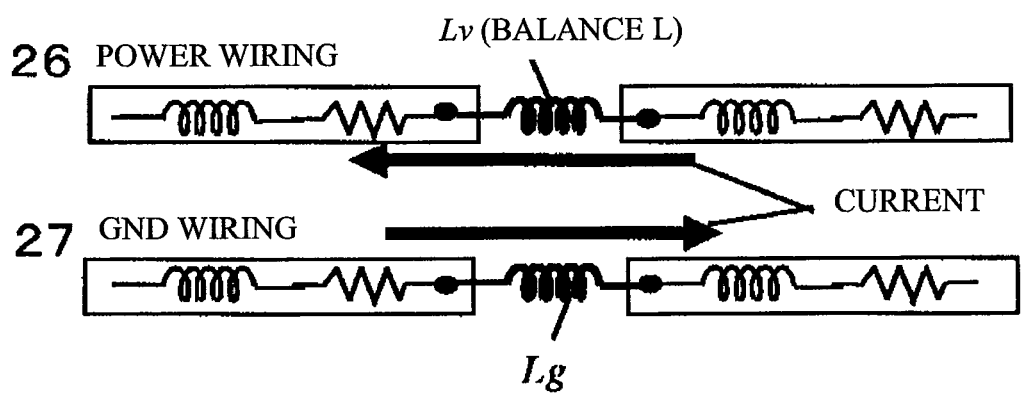
Figure 39B:
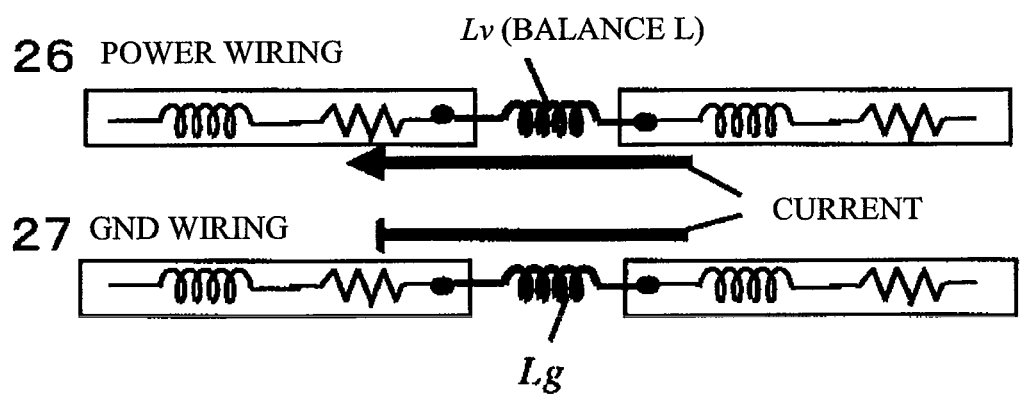

FIGS. 38A-38B are diagrams concerning unnecessary electromagnetic radiation which the inventors of the present invention have studied showing the analysis results of current direction in a harness; and FIGS. 39A-39B are diagrams concerning unnecessary electromagnetic radiation which the inventors of the present invention have studied showing approximate equivalent circuits of a printed-circuit substrate and a harness.

Figure 40A:
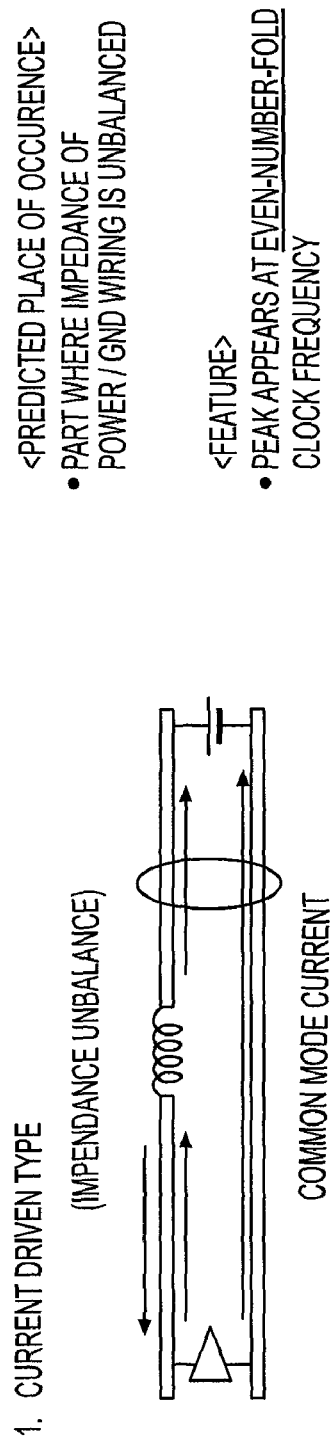
Figure 40B:
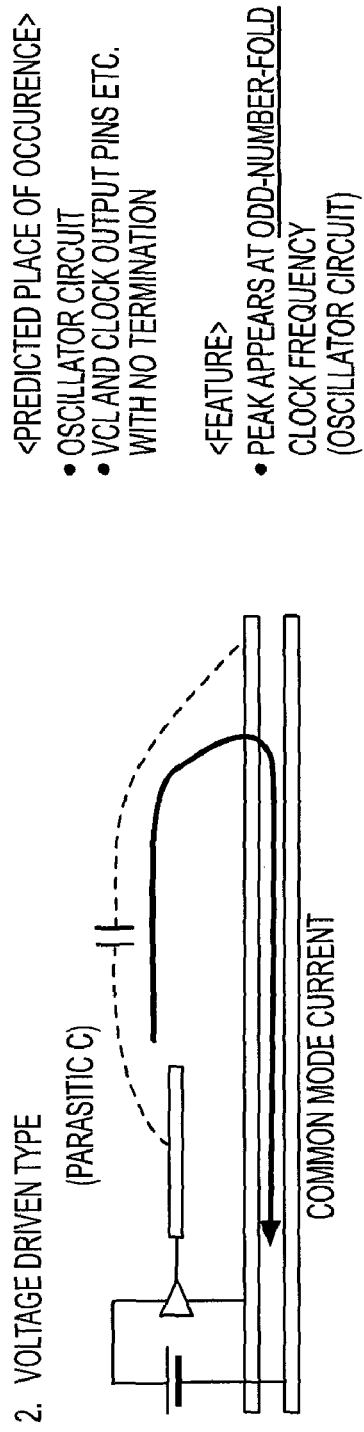

FIGS. 40A-40B are diagrams concerning Current Driven Type common mode current and Voltage Driven Type common mode current respectively.

BEST MODE FOR CARRYING OUT THE INVENTION

In the following embodiments, a description will be given by dividing into a plurality of sections or embodiments as occasion demands as a matter of convenience, however, they are not independent from each other except any particularly provided expressly, and are in a relation that one is a modified example of a part or an entire of the other, a detail, a supplementary explanation or the like thereof. Further, in the following embodiments, in the case of referring to a number and the like (including a number, a numerical value, an amount, a range and the like) of elements, the number is not limited to a specific number except a particularly defined case and a case of being limited to a specific number in principle, but may be equal to or more than the specific number or equal to or less than the specific number. Moreover, in the foregoing, the invention made by the inventors of the present invention has been concretely described based on the embodiments. However, it is needless to say that the present invention is not limited to the foregoing embodiments and various modifications and alterations can be made within the scope of the present invention.

First Embodiment

In a first embodiment, an example is described where an inductor element is inserted into a power-supply wiring and to correct impedance errors of the power-supply wiring and a GND wiring.

Figure 1:
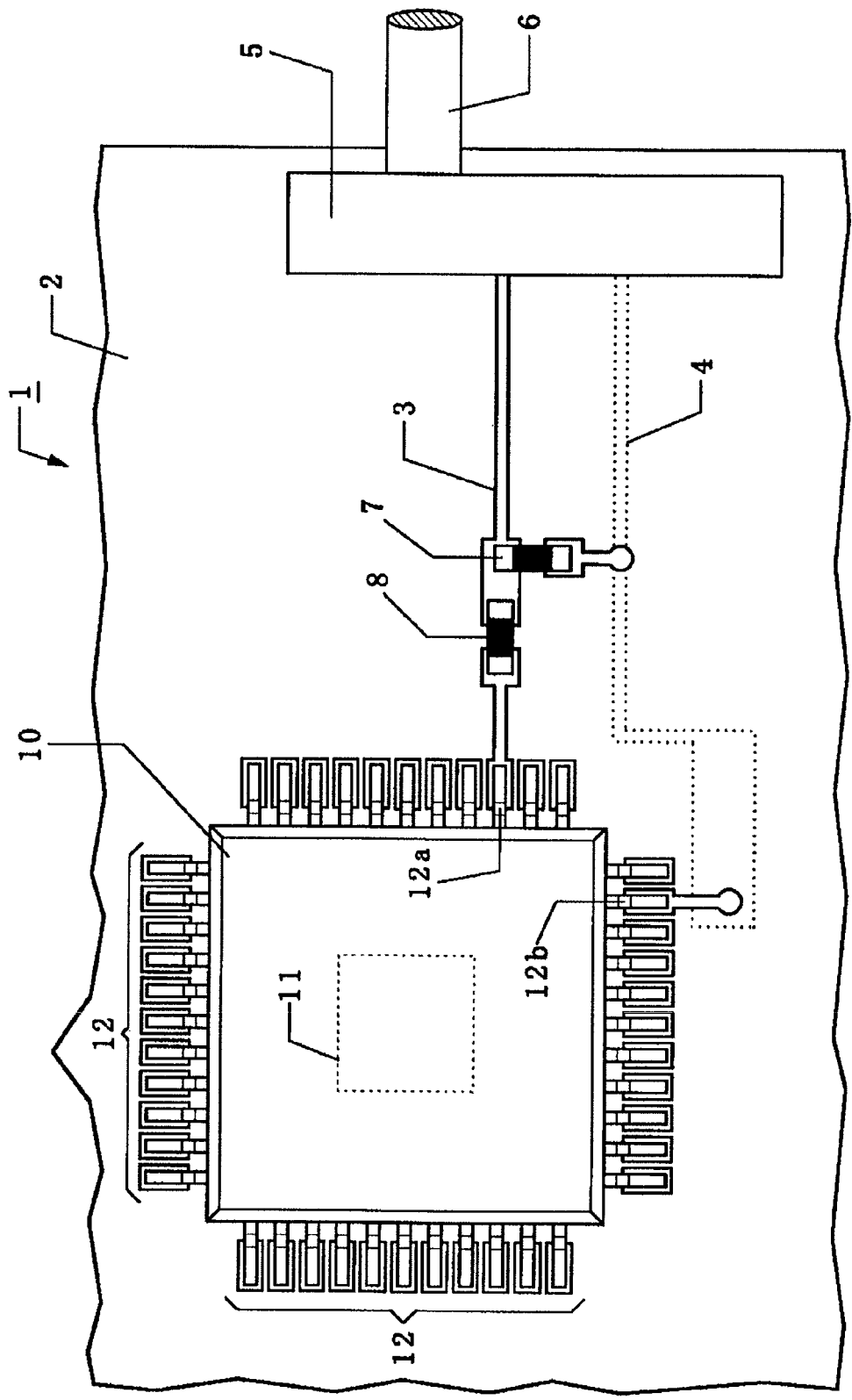
FIG. 1 is a plan view showing a schematic structure of an electronic device as a first embodiment according to the present invention.
Figure 2:
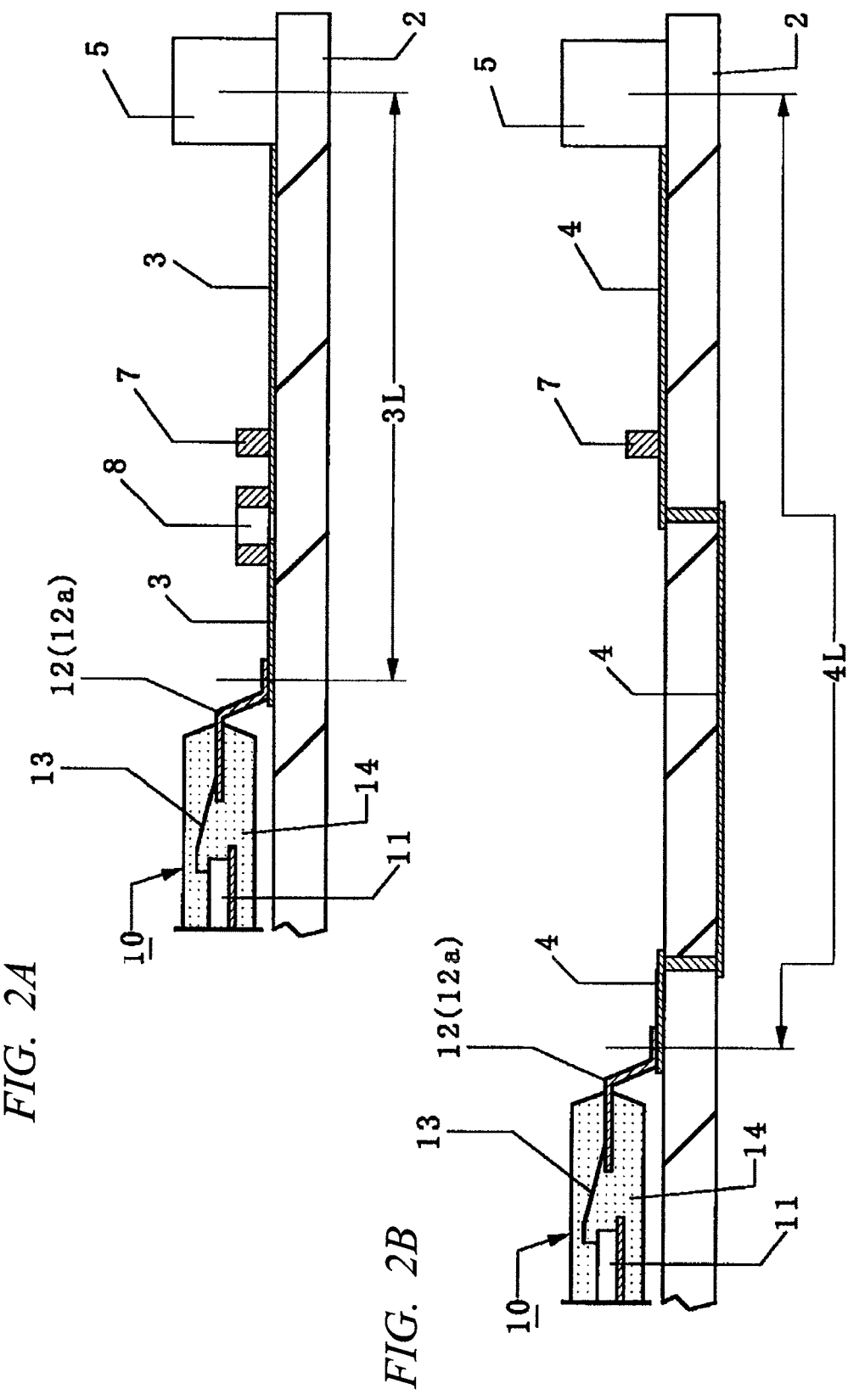
FIG. 2 is a cross sectional view showing schematic structures of the electronic device in FIG. 1 (FIG. 2A is a cross sectional view along a power-supply wiring, and FIG. 2B is a cross sectional view along a GND wiring)

FIG. 1 and FIG. 2 are diagrams showing an electronic device (electronic device) as the first embodiment according to the present invention, FIG. 1 is a plan view of the electronic device, and FIG. 2 is a cross sectional view of the electronic device (FIG. 2A is a cross sectional view along the power-supply wiring, and FIG. 2B is a cross sectional view along the GND wiring).

As shown in FIG. 1 and FIG. 2 (FIG. 2A, FIG. 2B), in the electronic device 1 of the first embodiment, as a wiring substrate, on a main surface of, for example, a printed-circuit substrate 2, a connector 5, a capacitor element 7, an inductor element 8, a microcomputer 10 and the like are equipped. As the capacitor element 7 and the inductor element 8, for example ones made of a rectangular surface-mount type (chip type) having electrodes at both the ends positioned at opposite sides to each other. The connector 5 is for connecting wirings of the printed-circuit substrate 2 and a wiring of a harness 6, and is arranged at the circumference of the printed-circuit substrate 2.

The printed-circuit substrate 2 is a two-layer wiring structure having wiring layers on front and back surfaces (the main surface and a back surface positioned on opposite sides to each other) of a core material made of a highly-elastic resin obtained by impregnating, for example, epoxy system or polyimide system resin into glass fibers. Further, the printed-circuit substrate 2 has a structure having a plurality of wires including a first power-supply wiring (hereinafter, referred to as power-supply wiring 3) to which a first power-supply potential (for example, 5 V) is applied (potentially fixed to the first power-supply potential), and a second power-supply wiring (hereinafter, referred to as GND wiring 4) to which a second power-supply potential lower than the first power-supply potential (for, example 0 V) is applied (potentially fixed to the second power-supply potential), and further including a signal wiring (not shown) used as transmission route of electric signals.

In the first embodiment, the power-supply wiring 3 is formed of a first wiring layer on the main surface side of the printed-circuit substrate 2. On the other hand, the GND wiring 4 has a structure including: a portion formed on the first wiring layer on the main surface side of the printed-circuit substrate 2; a portion formed on the second wiring layer of the back surface side (surface on the side opposite to the main surface) of the printed-circuit substrate 2; and a portion (through-hole wiring) that electrically connects these portions, and is formed in a connection hole of the printed-circuit substrate 2.

The microcomputer 10 has, although not limited to this, for example, a structure having: a semiconductor chip 11 where a logic operation circuit as an integrated circuit is mounted; a plurality of leads 12 arranged around the semiconductor chip 11; a plurality of bonding wires 13 that electrically connect a plurality of electrode pads of the semiconductor chip 11 and the plurality of leads 12 respectively; and a mold body 14 that molds the semiconductor chip 11, the plurality of leads 12, the plurality of bonding wires 13 and the like. Each of the plurality of leads 12 expands from inside to outside of the mold body 14, and a part of outer portion positioned outside of the mold body 12 is used as a terminal (connection portion).

The plurality of leads 12 include a power-supply lead 12a to which a first power-supply potential (for example, 5 V) is applied (potentially fixed to the first power-supply potential), a GND lead 12b to which a second power-supply potential lower than the first power-supply potential (for example, 0 V) is applied (potentially fixed to the second power-supply potential), and further include a signal lead used as a transmission route of electric signals.

In the mold body 14, its plane shape crossing the thickness direction is in a rectangular shape, and the power-supply lead 12a protrudes from a first side of the mold body 14, and the GND lead 12b protrudes from a second side different from the first side of the mold body 14.

An external terminal (first power-supply terminal) formed of the outer portion of the power-supply lead 12a is electrically and mechanically connected to the power-supply wiring 3, and an external terminal (second power-supply terminal) formed of the outer portion of the GND lead 12b is electrically and mechanically connected to the GND wiring 4.

The power-supply wiring 3 and the GND wiring 4 are electrically and mechanically connected to the connector 5. The power-supply wiring 3 ends at the portion where the outer portion of the power-supply lead 12a is connected and at the portion where the connector 5 is connected. In the same manner, the GND wiring 4 also ends at the portion where the outer portion of the GND lead 12b is connected and at the portion where the connector 5 is connected.

The capacitor element 7 is connected in parallel with the power-supply wiring 3 and the GND wiring 4. More particularly, in the capacitor element 7, one electrode is electrically and mechanically connected to the power-supply wiring 3, and the other electrode is electrically and mechanically connected to the GND wiring 4. That is, the capacitor element 7 is used as a bypass capacitor.

The power-supply wiring 3 that electrically connects the power-supply terminal formed of the power-supply lead 12a of the microcomputer 10 and the connector 5, and the GND wiring 4 that electrically connects the power-supply terminal formed of the GND lead 12b of the microcomputer 10 and the connector 5 are often routed under the influence of signal wirings and the microcomputer 10 and other electronic parts to be equipped, and so the wiring lengths from the power-supply terminal of the microcomputer 10 to the connector 5 differ. Further, as in the first embodiment, even in the case where the power-supply lead 12a and the GND lead 12b protrude from different sides of the mold body 14, wiring lengths of power-supply/GND wirings from the power-supply terminal of the microcomputer 10 to a connection portion of the connector 5 differ. In the first embodiment, a substantial wiring length 3L of the power-supply wiring 3 from the terminal portion (power-supply terminal) of the power-supply lead 12a of the microcomputer 10 to the connection portion of the connector 5 is shorter than a substantial wiring length 4L of the GND wiring 4 from terminal portion (power-supply terminal) of the GND lead 12b of the microcomputer 10 to the connector 5. It means, impedances of the power-supply wiring 3 and the GND wiring 4 are unbalanced.

Consequently, in the first embodiment, in order to correct the impedance error between the power-supply wiring 3 and the GND wiring 4, the inductor element 8 is connected in series to the power-supply wiring 3 whose wiring length 3L is short. More particularly, the power-supply wiring 3 is divided into two in the midst. One electrode of the inductor element 8 is electrically and mechanically connected to one of the divided portions and the other electrode of the inductor element 8 is electrically and mechanically connected to the other of the divided portions. Further, in the first embodiment, the inductor element 8 is connected (equipped) between the power-supply terminal of the microcomputer 10 and the capacitor element 7.

Herein, the low-noise mounting technology of an electronic device loading a microcomputer which the inventors of the present invention have studied is described in consideration of the evaluation results by the analysis and actual measurement concerning the common mode current explained previously. Hereinafter, results of examinations on: [1] a mounting method of bypass capacitor; and [2] a correction method of wiring impedance unbalance by chip inductor mounting are described in sequence.

[1]; Method of Mounting Bypass Capacitor

Herein, method of reducing common mode current of an electronic device loading a microcomputer by mounting the bypass capacitor is described. In the examinations on the mechanism of Current Driven Type common mode current occurrence mentioned above, it has been found that the common mode current occurs due to the impedance unbalance of power-supply and GND wirings in a printed-circuit substrate. Accordingly, examinations have been made by an analysis and an actual measurement to determine which way to mount a capacitor reduces common mode current occurrence can be reduced, before or after the impedance unbalance viewed from the microcomputer being the noise source.

Figure 14A:
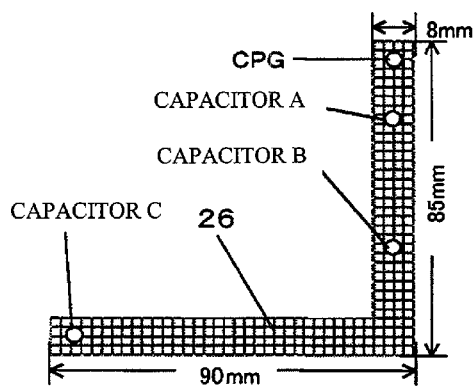
FIGS. 14A-14C are diagrams concerning unnecessary electromagnetic radiation which the inventors of the present invention have studied showing an analysis model of a Current Driven Type common mode current.
Figure 14B:
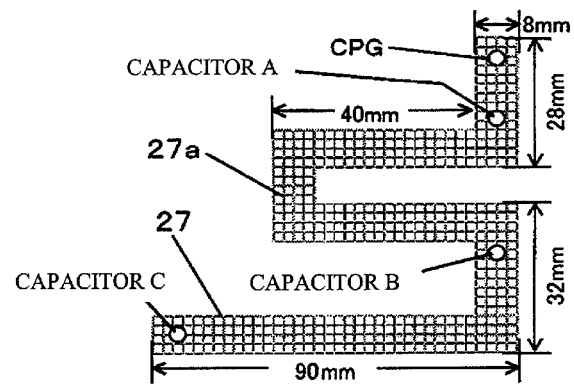
Figure 14C:
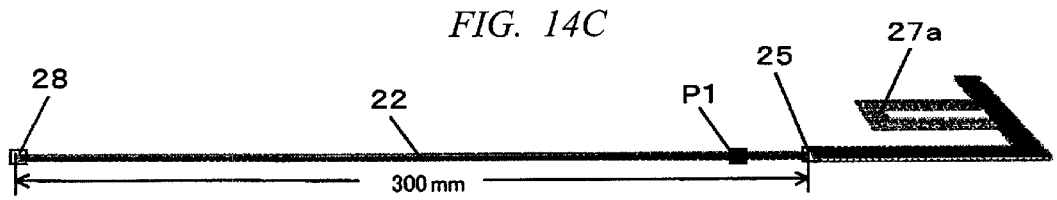
Figure 15A:
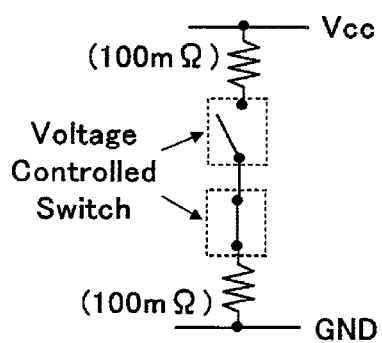
FIGS. 15A-15B are diagrams concerning unnecessary electromagnetic radiation which the inventors of the present invention have studied showing a CPG driver model and its switching characteristics.
Figure 15B:
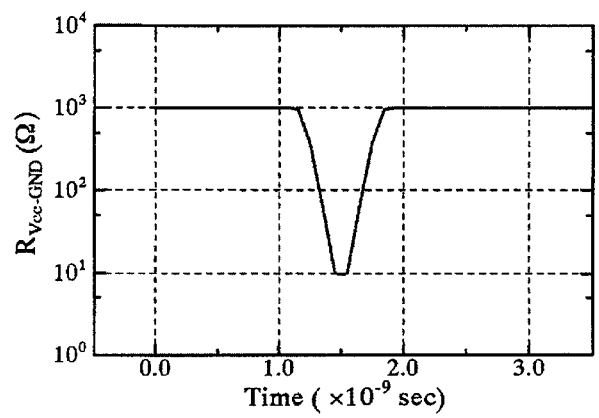
Figure 16:
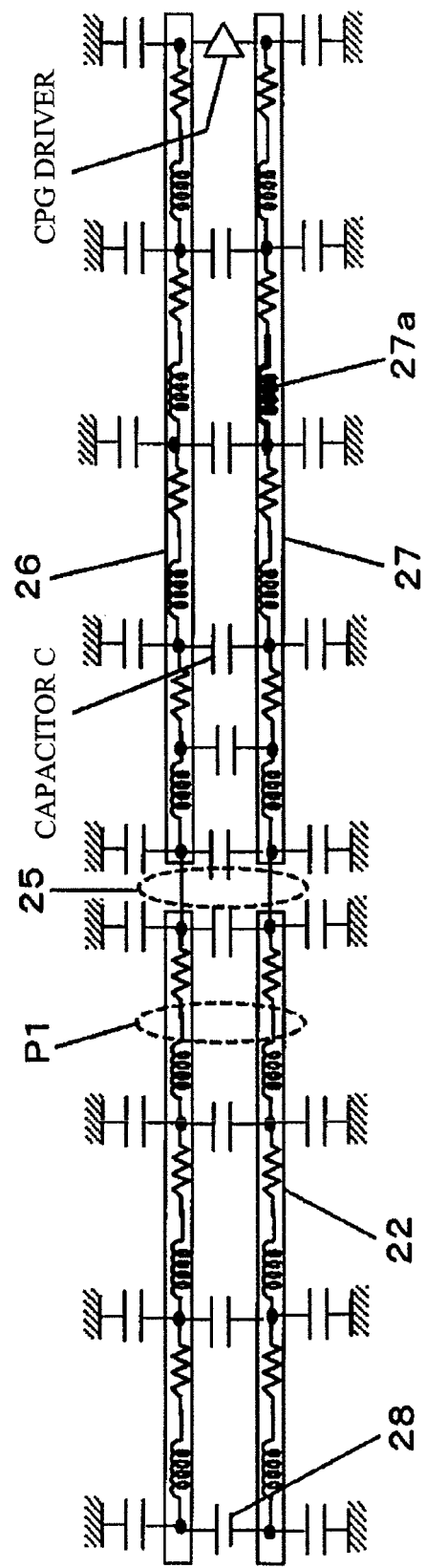
FIG. 16 is a diagram concerning unnecessary electromagnetic radiation which the inventors of the present invention have studied showing an approximate equivalent circuit of Current Driven Type common mode current evaluation.
Figure 17A:
FIGS. 17A-17D are diagrams concerning unnecessary electromagnetic radiation which the inventors of the present invention have studied showing the time change of analysis model current distribution.
Figure 17B:
Figure 17C:
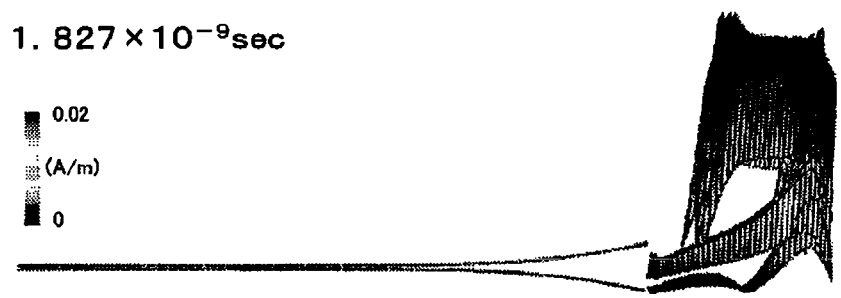
Figure 17D:
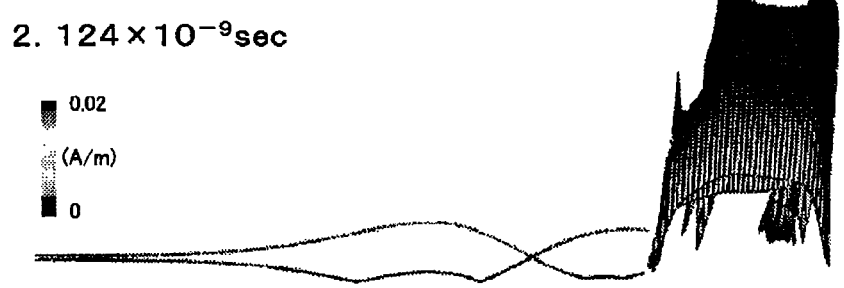
Figure 18:
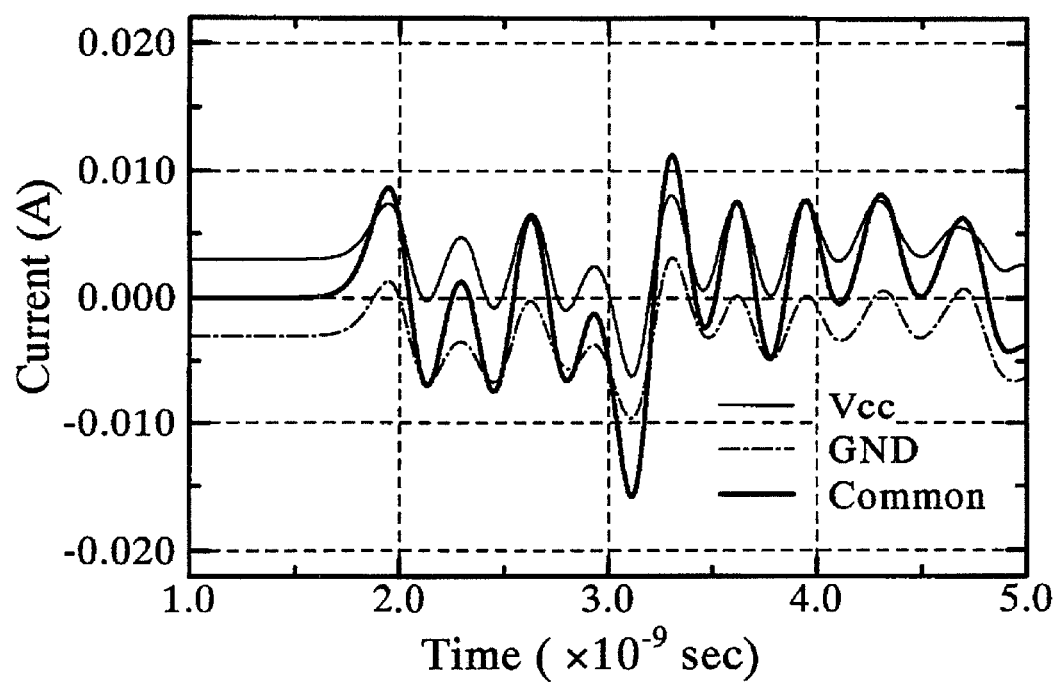
FIG. 18 is a diagram concerning unnecessary electromagnetic radiation which the inventors of the present invention have studied showing time changes of respective currents at a current evaluation position.
Figure 19A:
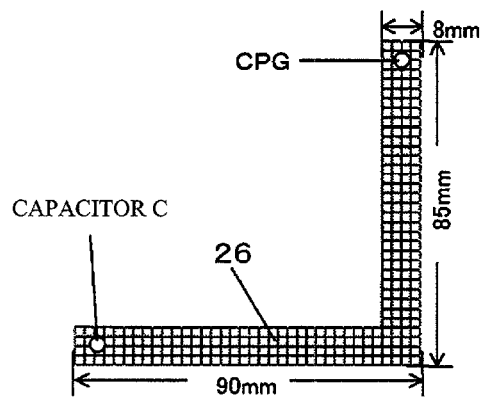
FIGS. 19A-19C are diagrams concerning unnecessary electromagnetic radiation which the inventors of the present invention have studied showing an analysis model of Current Driven Type common mode current.
Figure 19B:
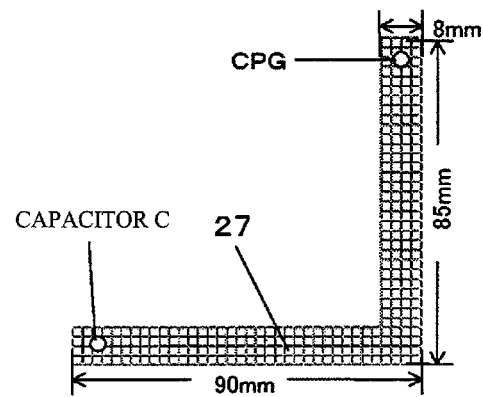
Figure 19C:
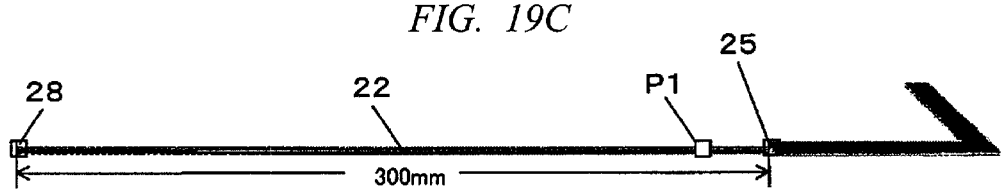
Figure 20A:
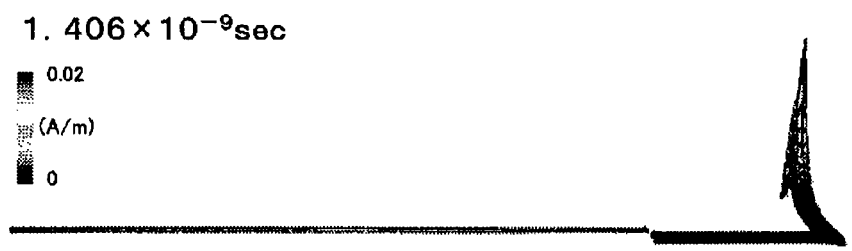
FIGS. 20A-20D are diagrams concerning unnecessary electromagnetic radiation which the inventors of the present invention have studied showing time changes of analysis model current distributions.
Figure 20B:
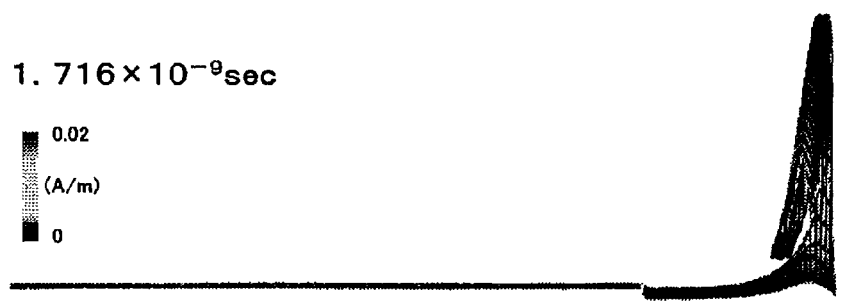
Figure 20C:
Figure 20D:
Figure 21:
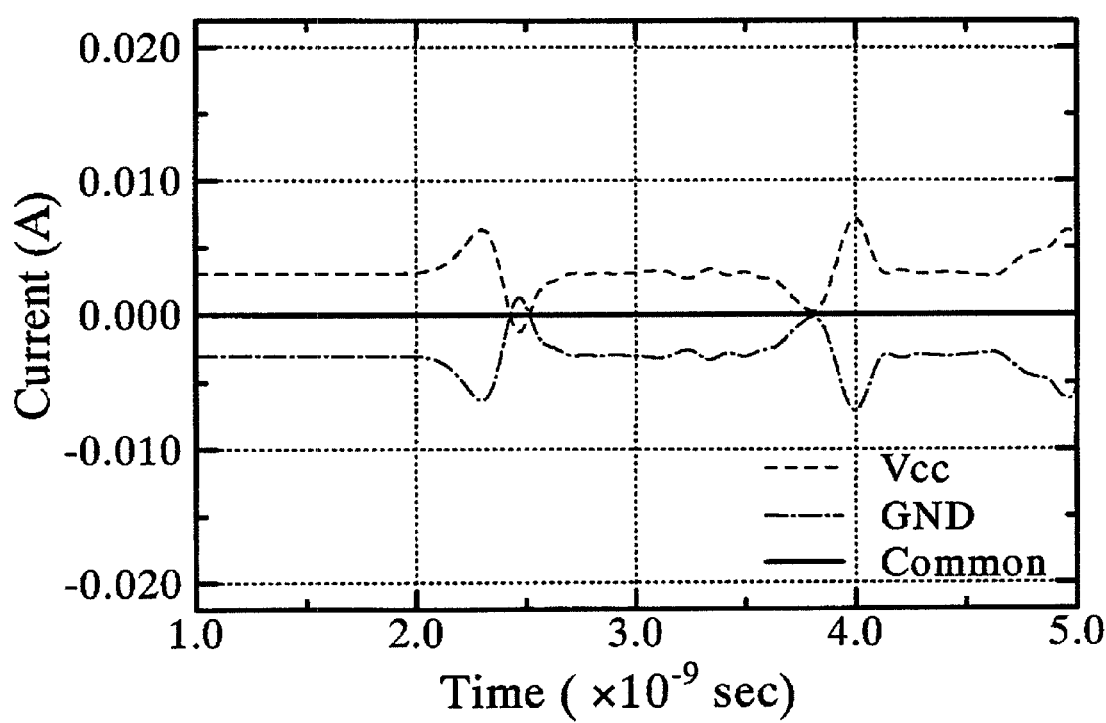
FIG. 21 is a diagram concerning unnecessary electromagnetic radiation which the inventors of the present invention have studied showing time changes of respective currents at the current evaluation position.
Figure 22A:
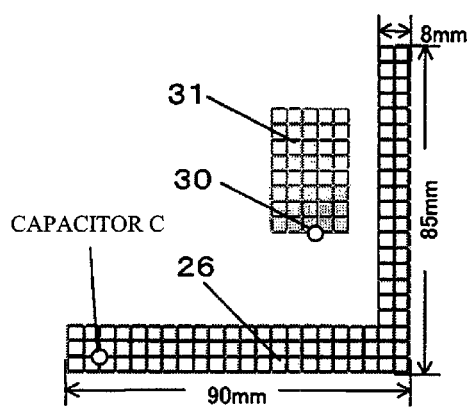
FIGS. 22A-22C are diagrams concerning unnecessary electromagnetic radiation which the inventors of the present invention have studied showing an analysis model of Voltage Driven Type common mode current.
Figure 22B:
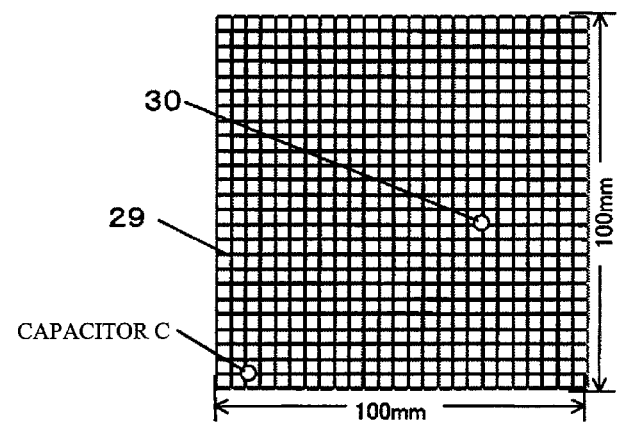
Figure 22C:
Figure 23:
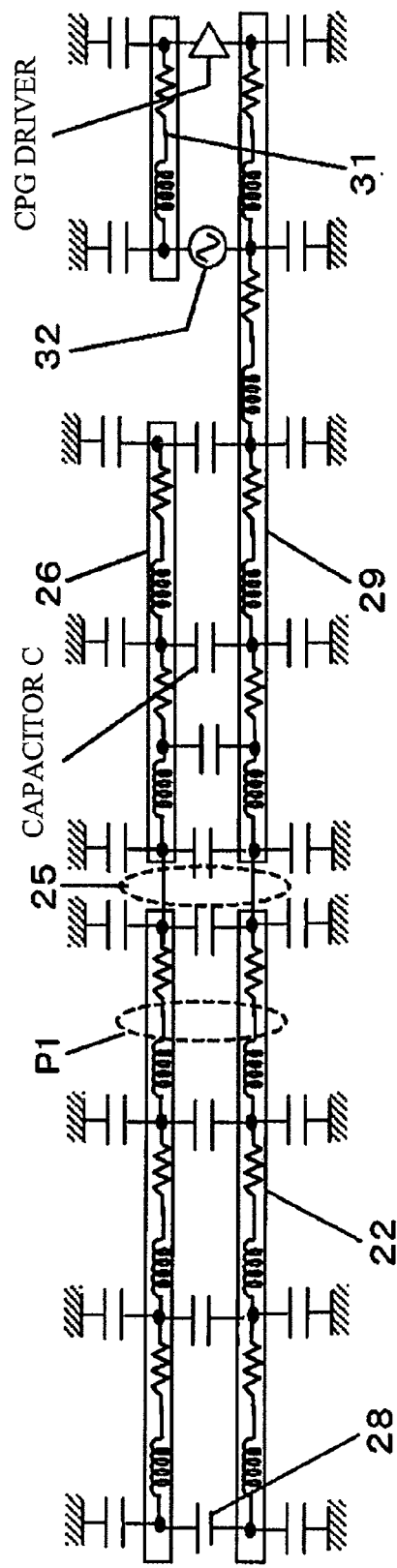
FIG. 23 is a diagram concerning unnecessary electromagnetic radiation which the inventors of the present invention have studied showing an approximate equivalent circuit of a Current Driven Type common mode current evaluation.
Figure 24A:
FIGS. 24A-24D are diagrams concerning unnecessary electromagnetic radiation which the inventors of the present invention have studied showing time changes of analysis model current distributions.
Figure 24B:
Figure 24C:
Figure 24D:
Figure 25:
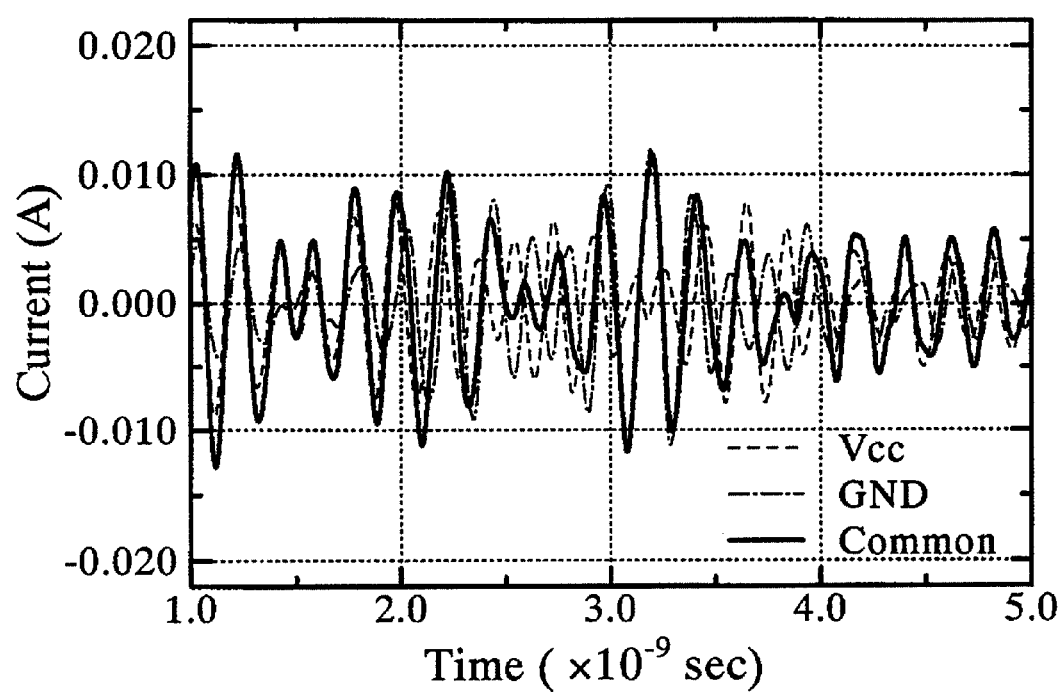
FIG. 25 is a diagram concerning unnecessary electromagnetic radiation which the inventors of the present invention have studied showing time changes of respective currents at the current evaluation position.

First, examination results by the analysis are shown. In the analysis, the model shown in FIG. 14 is used. In FIG. 14, a bypass capacitor is equipped before (position A (position of capacitor A) in FIG. 14) or after (position B (position of capacitor B) in FIG. 14) a looped impedance unbalance wiring (unbalance portion 27a), and changes of the occurring common mode current amount are evaluated. Meanwhile, in the evaluation, a transient analysis by a circuit analysis is made, and an evaluation is made by peak values (difference between the maximum value and the minimum value) of the occurring common mode current.

Figure 31:
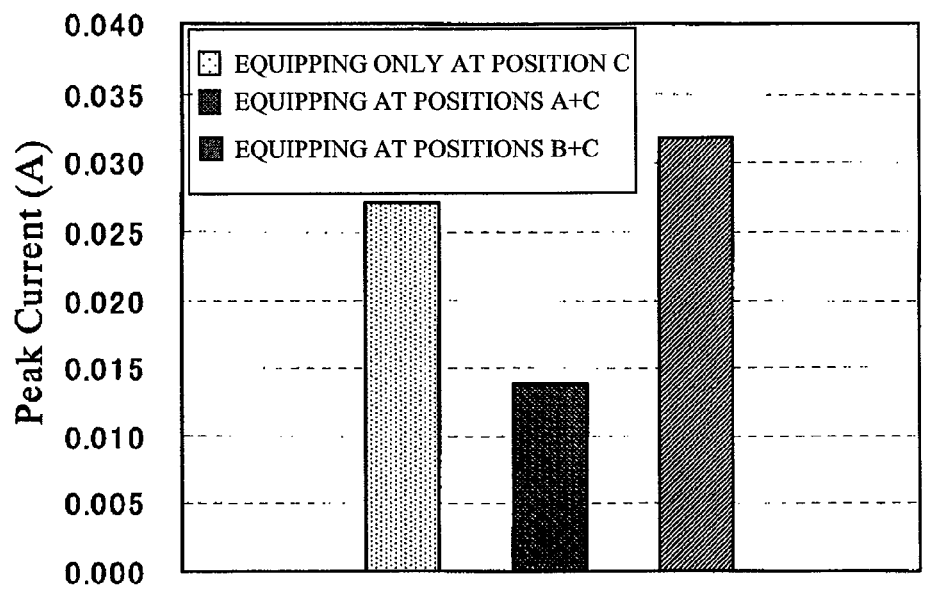
FIG. 31 is a diagram concerning unnecessary electromagnetic radiation which the inventors of the present invention have studied showing the analysis results of common mode current according to mounting positions of a bypass capacitor.

The evaluation results by the analysis are shown in FIG. 31 (a figure showing results of the common mode current analysis at positions of mounting the bypass capacitor). From FIG. 31, it is found that, in the case where the bypass capacitor is equipped before the impedance unbalance wiring (unbalance portion 27a) (position A in FIG. 14), in comparison with the case of mounting nothing, it is possible to reduce the occurrence of common mode current by 49% at maximum. On the other hand, in the case where the bypass capacitor is arranged after the impedance unbalance wiring (unbalance portion 27a) (position B in FIG. 14), in comparison with the case of mounting nothing, the common mode current was increased by approximately 17%.

Figure 26A:
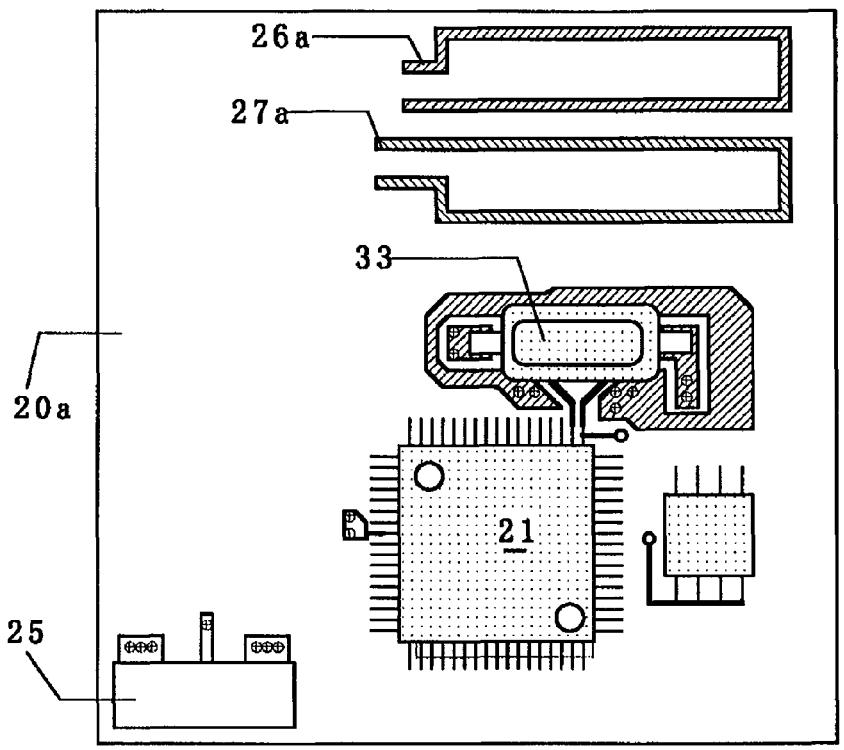
FIGS. 26A-26B are diagrams concerning unnecessary electromagnetic radiation which the inventors of the present invention have studied showing an evaluation substrate used for a common mode current measurement.
Figure 26B:
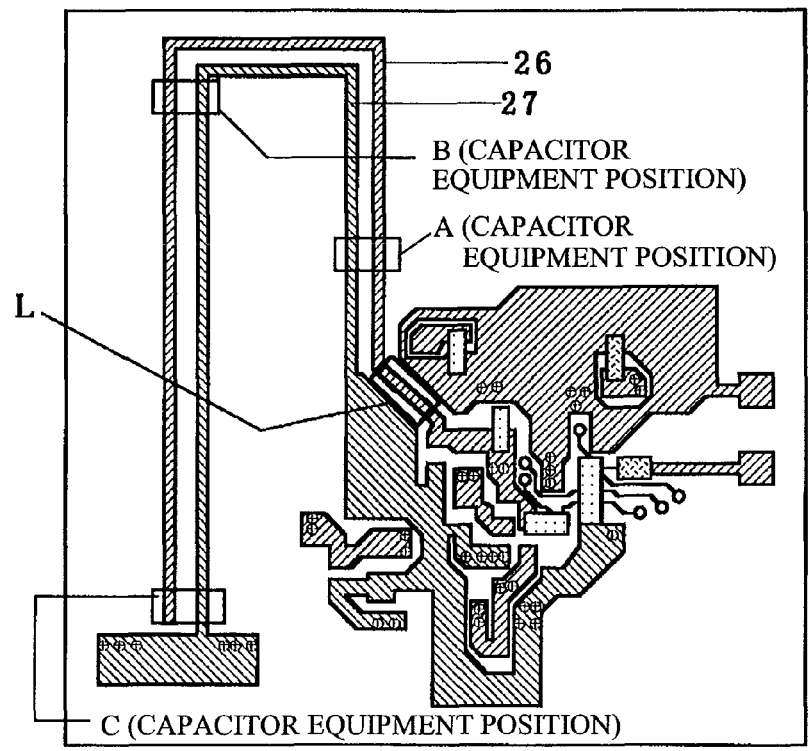
Figure 27:
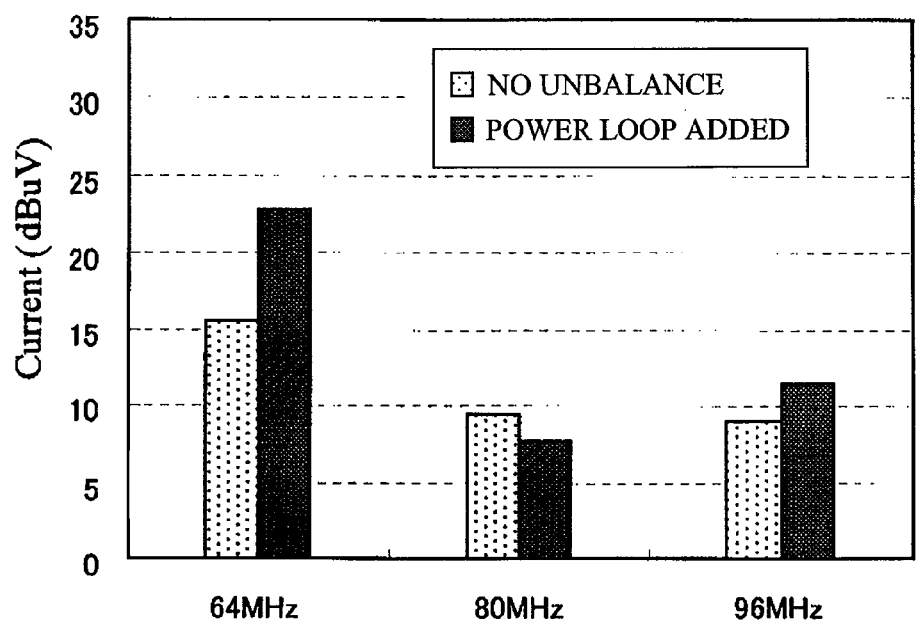
FIG. 27 is a diagram concerning unnecessary electromagnetic radiation which the inventors of the present invention have studied showing the measurement results of common mode current in the case when unbalance is added to only a power-supply wiring.
Figure 28:
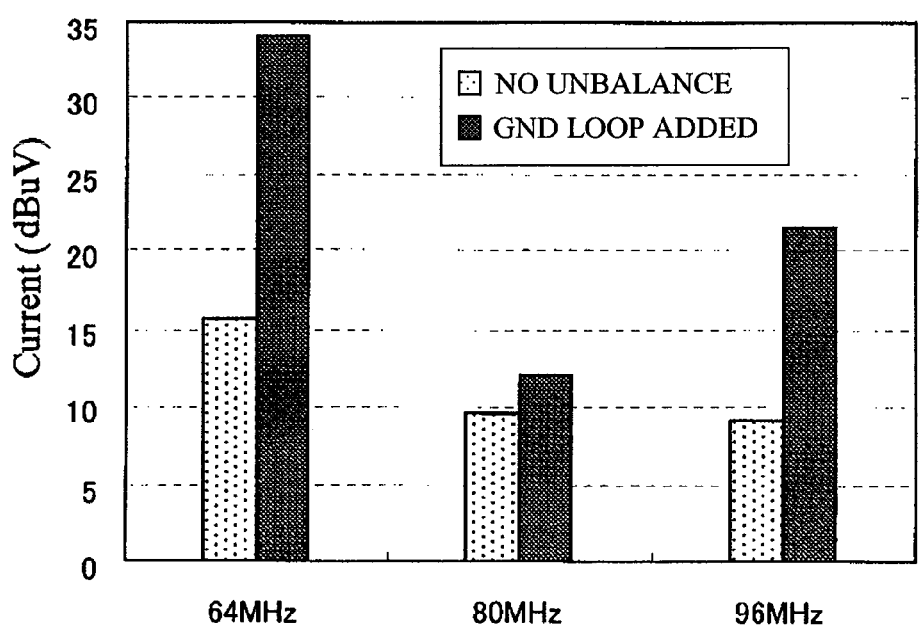
FIG. 28 is a diagram concerning unnecessary electromagnetic radiation which the inventors of the present invention have studied showing the measurement results of common mode current in the case when unbalance is added to only a GND wiring.
Figure 29:
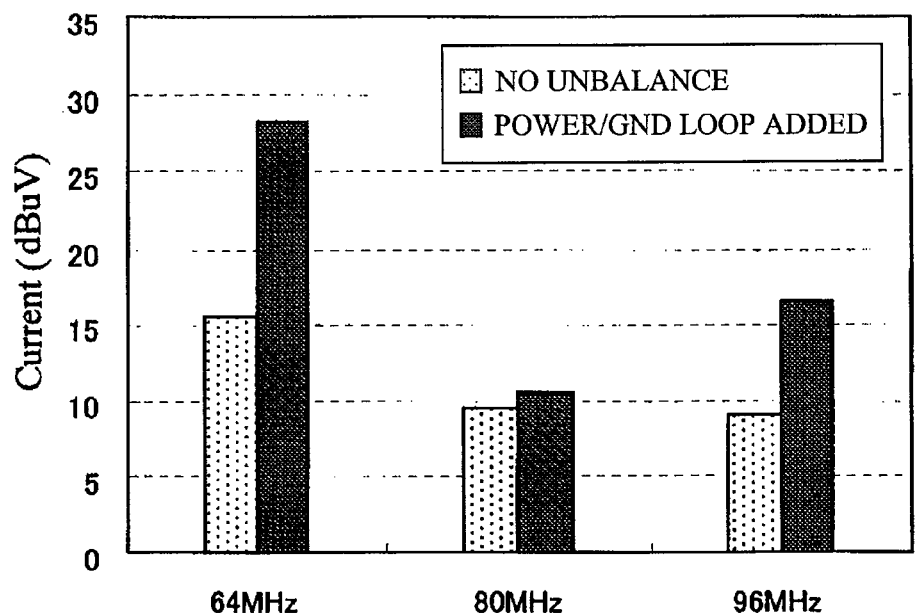
FIG. 29 is a diagram concerning unnecessary electromagnetic radiation which the inventors of the present invention have studied showing the measurement results of common mode current in the case when unbalance is added to power supply and GND wirings.
Figure 30:
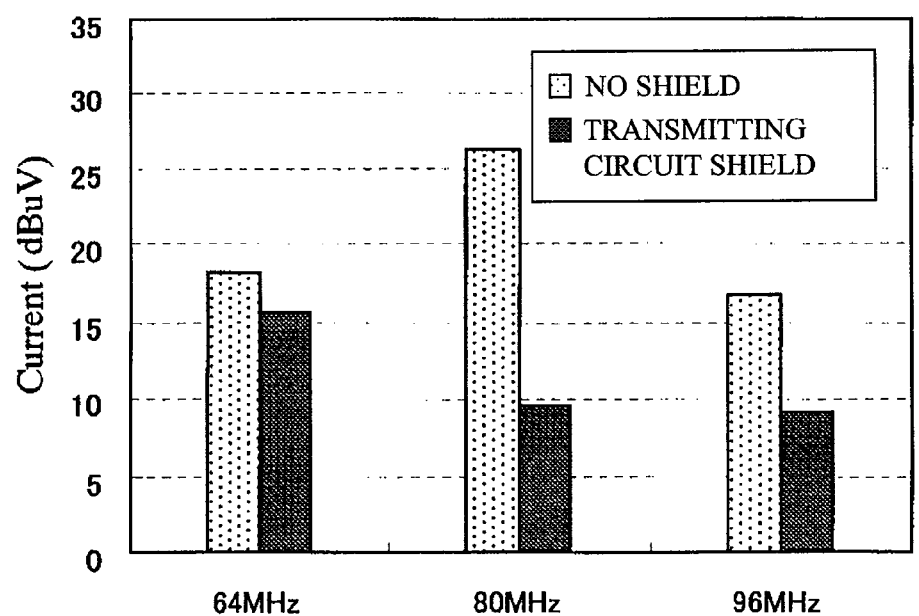
FIG. 30 is a diagram concerning unnecessary electromagnetic radiation which the inventors of the present invention have studied showing the measurement results of common mode current in the case when a transmitting circuit is shielded.

Next, the examination results by the actual measurement are shown. In the measurement, an evaluation substrate shown in FIG. 26 is used. In this evaluation substrate, in the same manner as in the previous analysis, an unbalance loop is added to the GND wiring. In FIG. 26, a bypass capacitor is equipped before the looped impedance unbalance wiring (position A (capacitor package position) in FIG. 26) or after the looped impedance unbalance wiring (position B (capacitor package position) in FIG. 26), and changes of the occurring common mode current are evaluated. Note that, in the measurement, spectra of the common mode current are evaluated by a spectrum analyzer.

Figure 32:
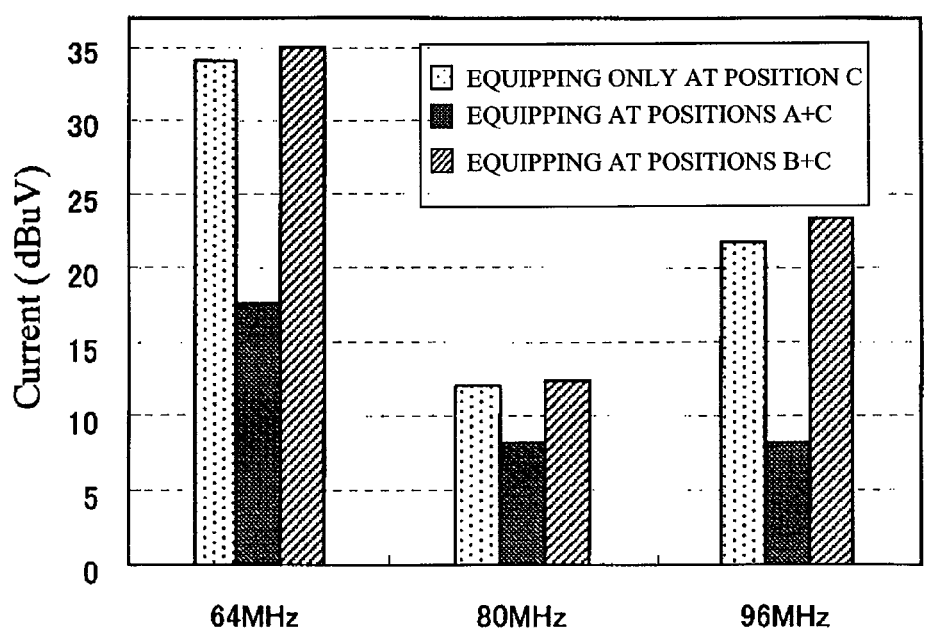
FIG. 32 is a diagram concerning unnecessary electromagnetic radiation which the inventors of the present invention have studied showing the actual measurement results of common mode current according to mounting positions of the bypass capacitor.

In FIG. 32, actual measurement results of the common mode current at positions of mounting the bypass capacitor are shown. From FIG. 32, it is found that, at even-number-fold higher harmonics of the microcomputer operating frequency (64 MHz and 94 MHz), in the case where the bypass capacitor is equipped before the impedance unbalance wiring, in comparison with the case of no mounting, it is possible to reduce the common mode current occurrence by 1.5 dB and 13.4 dB, respectively. On the other hand, in the case where the bypass capacitor is equipped after the impedance unbalance wiring, in comparison with the case of no mounting, the amount of the occurring the common mode current is increased. This reproduces the tendency of the analysis results. Further, it is known that, at an odd-number-fold higher harmonic of the microcomputer operating frequency (80 MHz), even when capacitor is equipped before and after the impedance unbalance, the change amount of the occurring common mode current is smaller than that in the even-number-fold higher harmonic.

From the foregoing, it is found that the method of mounting a bypass capacitor is effective for reducing the Current Driven Type common mode current that occurs at the even-number-fold microcomputer operating frequency, but does not affect on reducing the Voltage Driven Type common mode current that occurs at odd-number-fold higher harmonic.

[2]; Correction Method of Wiring Impedance Unbalance by Mounting Chip Inductor

Herein, by mounting a chip inductor to power-source/GND wirings, the method to reduce the amount of occurring common mode current of an electronic device loading a microcomputer is described. Examinations are made by an analysis and an actual measurement since it is possible to correct the impedance unbalance of a printed-circuit substrate wiring as the source of the Current Driven Type common mode noise occurrence by mounting a chip inductor.

Figure 33A:
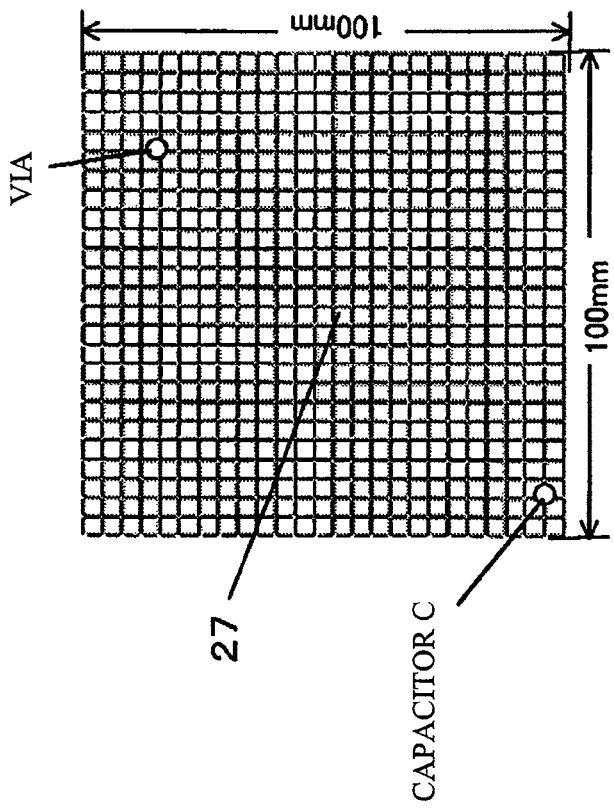
FIGS. 33A-33C are diagrams concerning unnecessary electromagnetic radiation which the inventors of the present invention have studied showing an analysis model of a correction method of wiring impedance by mounting a chip inductor.
Figure 33B:
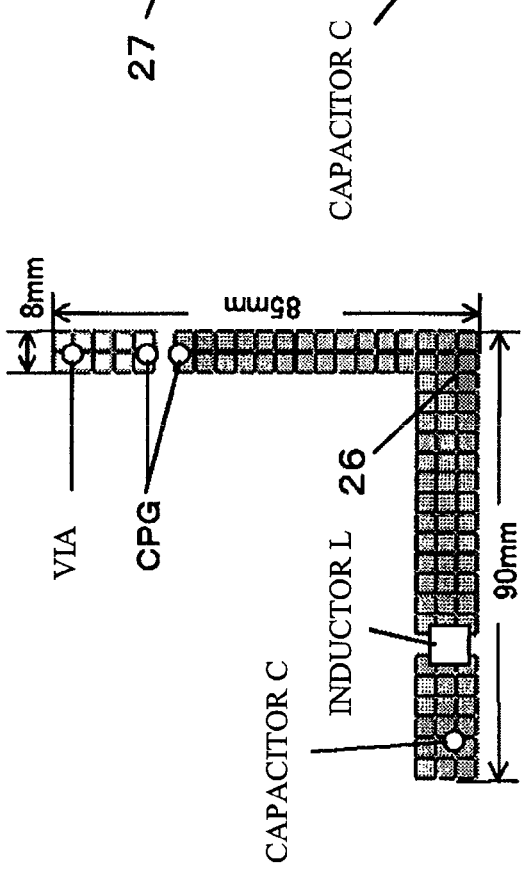
Figure 33C:
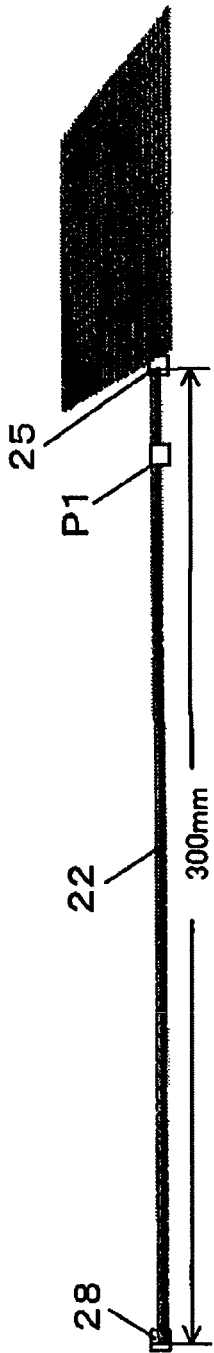
Figure 34:
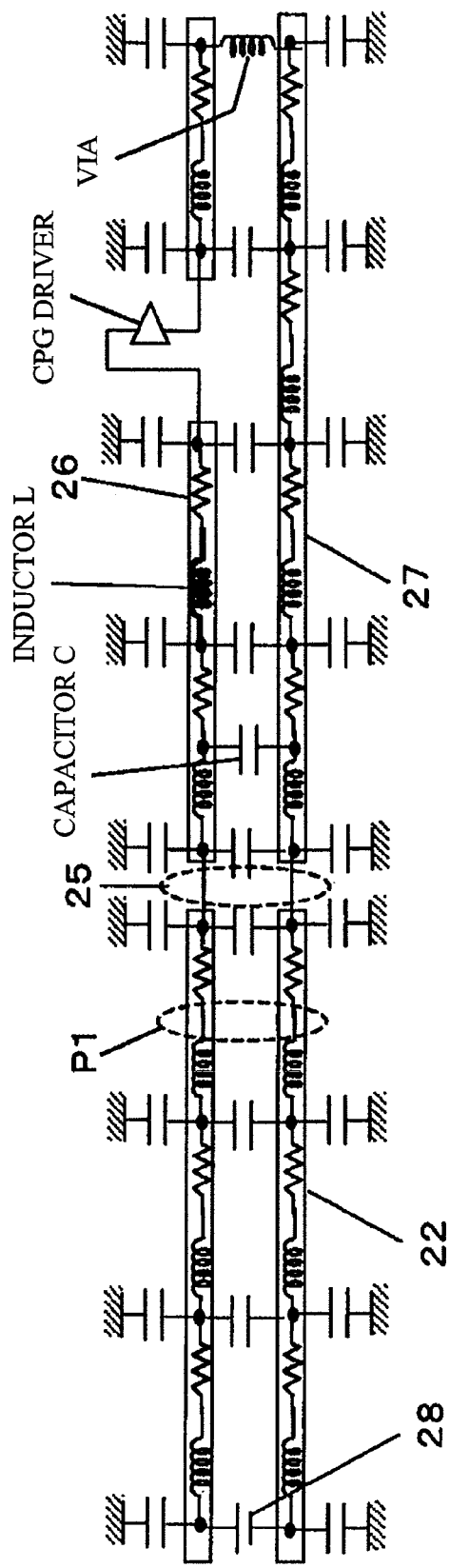
FIG. 34 is a diagram concerning unnecessary electromagnetic radiation which the inventors of the present invention have studied showing an approximate equivalent circuit of the correction method of wiring impedance by mounting a chip inductor.

First, the examination results by the analysis are shown. In the analysis, to inductor mounting position L (inductor L)

shown in FIG. 33 (a figure showing an analysis model of a correction method of wiring impedance by chip inductor mounting), inductor elements of various values are equipped, and changes of common mode current that occurs at an evaluation position P1 of the harness are evaluated. This approximate equivalent circuit is shown in FIG. 34 (a figure showing an approximate equivalent circuit of the correction method of wiring impedance by chip inductor mounting). Meanwhile, in the evaluation, a transient analysis by a circuit analysis is made, and an evaluation is made by peak values of the occurring common mode current (difference between the maximum value and the minimum value). In FIG. 33, FIG. 33A shows the power-supply wiring of the first layer, FIG. 33B shows the GND wiring of the second layer, and FIG. 33C shows the whole image of the model.

Figure 35:
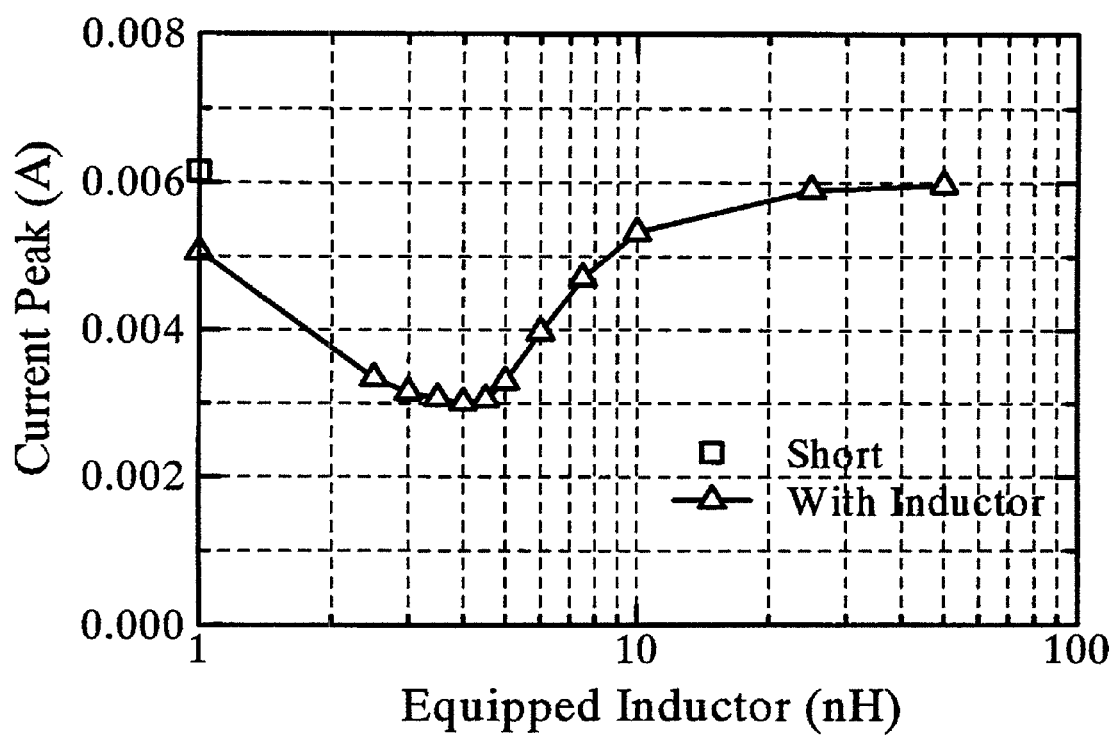
FIG. 35 is a diagram concerning unnecessary electromagnetic radiation which the inventors of the present invention have studied showing a change of common mode current amount according to equipped inductor values.
Figure 36A:
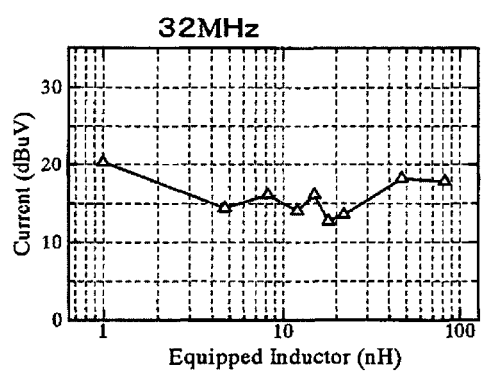
FIGS. 36A-36D are diagrams concerning unnecessary electromagnetic radiation which the inventors of the present invention have studied showing the measurement results of common mode current (even-number-fold higher harmonic) with mounting a chip inductor.
Figure 36B:
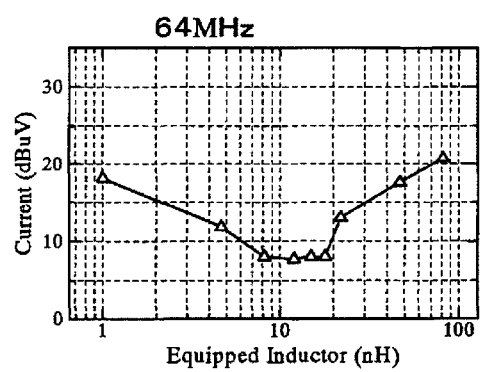
Figure 36C:
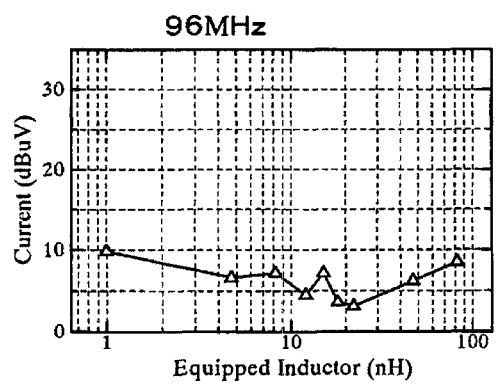
Figure 36D:
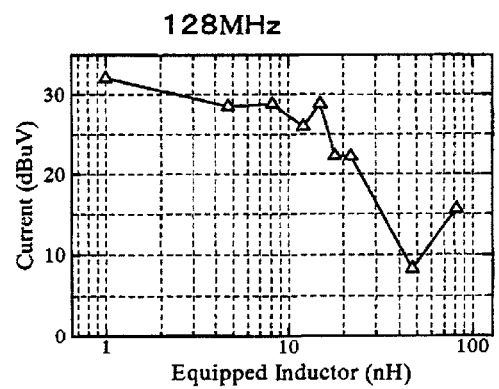

The evaluation results by the analysis are shown in FIG. 35 (a figure showing the change of the common mode current amount according to equipped inductor values). From FIG. 35, it is found that, when the equipped inductor is about 4 nH, the common mode current amount becomes lowest. That is, it is found that there is an optimal value of inductor value to reduction of common mode current.

Next, the evaluation results by the actual measurement are described. In the actual measurement, the evaluation substrate shown in FIG. 26 is used. In the evaluation substrate used in the measurement, the unbalance wiring of the power supply and GND is not added. Further, to the mounting of the position chip inductor (inductor mounting position L) in FIG. 26, inductor elements of various values are equipped, and the amount of common mode current that occurs at the harness position is evaluated. Meanwhile, in the measurement, spectra of common mode current are evaluated by a spectrum analyzer.

In FIG. 36 (a figure showing the measurement results of common mode current (even-number-fold higher harmonic) at the moment of mounting chip inductor) and FIG. 37 (a figure showing the measurement results of common mode current (odd-number-fold higher harmonic) at the moment of mounting chip inductor), the actual measurement results are shown. From FIG. 36, it is found that, at even-number-fold higher harmonics of the microcomputer operation frequency (FIG. 36A 32 MHz, FIG. 36B 64 MHz, FIG. 36C 96 MHz, FIG. 36D 128 MHz), the amount of occurring common mode current changes by the equipped inductor values. Further, it is found that, in any frequency of the even-number-fold higher harmonics, there is an optimal value of inductor value to reduction of common mode current. This coincides with the tendency of analysis results.

On the other hand, from FIG. 37, at odd-number-fold higher harmonics of the microcomputer operating frequency (FIG. 37A 48 MHz, FIG. 37B 80 MHz, FIG. 37C 112 MHz), irrespective of the equipped inductor value, the amount of common mode current becomes almost constant.

From the foregoing, it is found that the correction method of the wiring impedance unbalance by chip inductor mounting is effective for reducing the Current Driven Type common mode current that occurs at even-number-fold higher harmonics of the microcomputer operating frequency, but does not affect on reducing Voltage Driven Type common mode current that occurs at odd-number-fold higher harmonic.

Finally, examinations are made on the reason of the correction of the wiring impedance balance by chip inductor mounting being effective for reducing Current Driven type common mode current and does not affect on the Voltage Driven Type common mode current. FIG. 38 shows graphs of time variations of a current vector and current in either Current Driven Type/voltage Driven Type harnesses, at the examination on the mechanism of common mode current occurrence in the previous section. In FIG. 38, FIG. 38A is for the Current Driven Type, and FIG. 38B is for the Voltage Driven Type.

In the case of Current Driven Type, it is found that, as shown in FIG. 38A, the currents flowing through the harness head opposite directions in the power supply line and the GND line, and the difference between these currents becomes the common mode current. On the other hand, in the case of the Voltage Driven Type, it is known that, as shown in FIG. 38B, the currents flowing through the harness head a same direction in the power supply and GND lines, and the total of these currents becomes the common mode current. To summarize the above, approximate equivalent circuits of the printed-circuit substrate and the harness with respect to the Current Driven Type/voltage Driven Type common mode currents in balance inductor mounting are shown in FIG. 39. In FIG. 39, FIG. 39A is for the Current Driven Type, and FIG. 39B is for the Voltage Driven Type.

From FIG. 39A, in the Current Driven Type common mode current, noises transmit in a transmission mode where the current flows through the power-supply wiring and the GND wiring in the opposite directions to each other. The impedance in this transmission mode is expressed by the following equation.

$$L_{total}=L_v+L_g \quad (12)$$

Thereby, it is found that, as Lv is made large by mounting the balance inductor, $L_{total}$ is increased in proportion with this. As a result, the noise current changes according to the equipped balance inductor. On the other hand, from FIG. 39B, in the voltage Driven Type common mode current, noises transmit in a transmission mode where the current flows through the power-supply wiring and GND wiring in the same direction. The impedance in this transmission mode is expressed by the following equation.

$$L_{total}=L_v \cdot L_g/(L_v-L_g) \quad (13)$$

From this equation, when $L_v$ is made large by balance inductor mounting (even at the limit of $L_v \gg L_g$), the entire impedance becomes $L_g$, and the impedance of the current transmission mode of the Voltage Driven Type does not change so much. As a result, even if the balance inductor is equipped, the noise current hardly changes.

From the above, it can be explained that the correction method of wiring impedance by chip inductor package is effective for reducing the Current Driven Type common mode current and does not affect on reducing the Voltage Driven Type common mode current.

In the present first embodiment, as shown in FIG. 1 and FIG. 2, the substantial wiring length 3L of the power-supply wiring 3 from the terminal portion (power-supply terminal) of the power-supply lead 12a of the microcomputer 10 to a connection portion of the connector 5 is shorter than the substantial wiring length 4L of the GND wiring 4 from the terminal portion (power-supply terminal) of the GND lead 12b of the microcomputer 10 to the connector 5, and impedances of the power-supply wiring 3 and the GND wiring 4 are unbalanced.

Therefore, in the present first embodiment, in order to correct the impedance error between the power-supply wiring 3 and the GND wiring 4, the inductor element 8 is connected in series to the power-supply wiring 3 whose wiring length 3L is short. As the inductor element 8, one of inductor value optimal to reduce the common mode current of even-number-fold higher harmonic is packaged.

Thus, by correcting the impedance unbalance of power-supply/GND wirings from the power-supply terminal of the microcomputer 10 to the connector 5 by inductor element, it is possible to reduce the Current Driven Type common mode current that occurs in the harness 5 at even-number-fold higher harmonics of the microcomputer operating frequency and to control unnecessary electromagnetic radiation which occurs from the harness 5 due to this Current Driven Type common mode current.

Further, impedance errors of the power-supply/GND wirings are corrected by mounting the inductor element 8 and accordingly it is possible to simplify the manufacture of the electronic device 1. Furthermore, since there is no need to do drastic design changes or design to take large margins to noise, it is possible to make the electronic device 1 compact and low-cost.

In the present first embodiment, the inductor element 8 is connected (equipped) between the power-supply terminal of the microcomputer 10 and the capacitor element 7.

As described above, electric signals sent respectively from the power supply and the GND of the microcomputer 10 are not transmitted to the connector 5 at the same timing, because of a phase difference due to the impedance difference of the power supply/GND wirings. Therefore, the phase of transmitted electric signal is reflected diffusely at the connector 5, and part thereof becomes the noise. In the case of the first embodiment, in order to restrict the differential mode current as the cause of noise, the bypass capacitor is connected in parallel with the first and second power-supply wirings. If the electric signals sent respectively from the power supply and the GND of the microcomputer 10 are not transmitted to (arrived) the bypass capacitor at the same timing, diffuse reflection cannot be restricted. That is, in the state where wiring lengths are made to be the same (no error between impedances of the power-supply/GND wirings), if the electric signals occurred respectively from the power supply and GND do not reach the bypass capacitor, it is not possible to restrict the occurrence of the diffuse reflection of phase. Accordingly, it is not possible to restrict the occurrence of noise.

However, as in the present first embodiment, by arranging the inductor element 8 between the power-supply terminal of the microcomputer 10 and the capacitor element 7, it is possible to make the impedance errors of power-supply wiring and GND wiring same. Therefore, there is no phase difference in the electric signals sent respectively from the power supply and the GND of the microcomputer 10 and they can be transmitted to (reach) the capacitor element 7 at the same timing, and accordingly, it is possible to restrict the occurrence of the diffuse reflection of phase. As a result, it is possible to reduce noises.

By arranging a pad to load the inductance element 8 on the printed-circuit substrate, after loading parts, it is possible to search and determine the optimal value of the inductance element 8 with confirming the amplitude of the common mode current by a measurement.

Note that, the impedance error of the power-supply/GND wirings occurs also inside the package of the microcomputer, however, the wiring length of the printed-circuit substrate is far longer than that inside the package. Accordingly, when the impedance error of the power-supply/GND wirings is corrected in the printed-circuit substrate, it is possible to reduce the impedance error of the power-supply/GND wirings in the printed-circuit substrate including the impedance error in the package.

Further, by the impedance error correction of the first and second power-supply wirings, the common mode current that flows through the harness where the third power-supply wiring is connected to the first power-supply wiring and the fourth power-supply wiring is connected to the second power-supply wiring via the connector 5 can be restricted to 30 dBuA or below at the maximum peak of 30 to 200 MHz.

Second Embodiment

Figure 3:
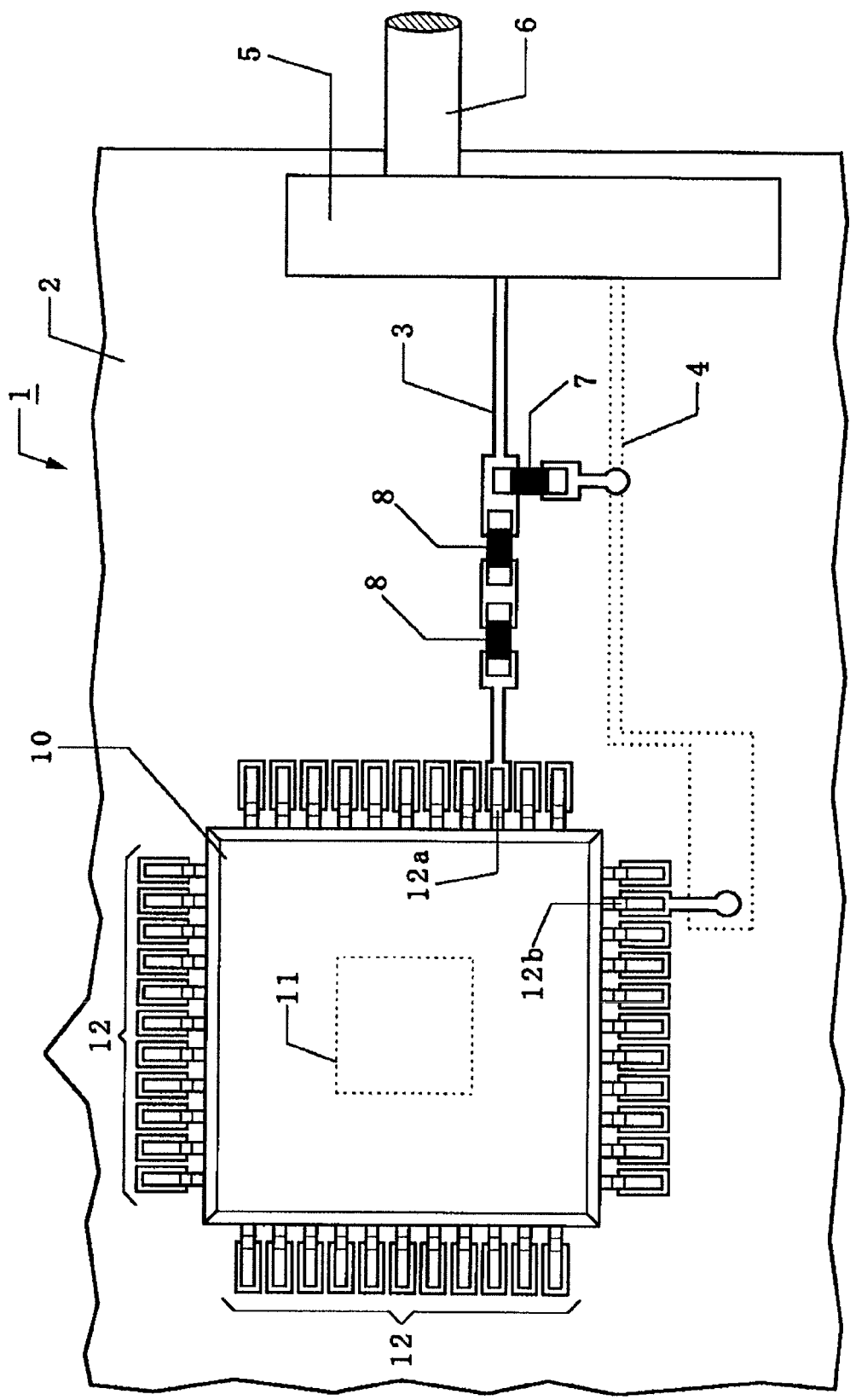
FIG. 3 is a plan view showing a schematic structure of an electronic device as a second embodiment according to the present invention.

FIG. 3 is a plan view showing a schematic structure of an electronic device as a second embodiment according to the present invention.

In the first embodiment described above, an example where the impedance error of power-supply/GND wirings is corrected by one inductor element 8 has been explained. Meanwhile, as shown in FIG. 3, the impedance error of power-supply/GND wirings may be corrected by two or more inductor elements 8.

Third Embodiment

Figure 4:
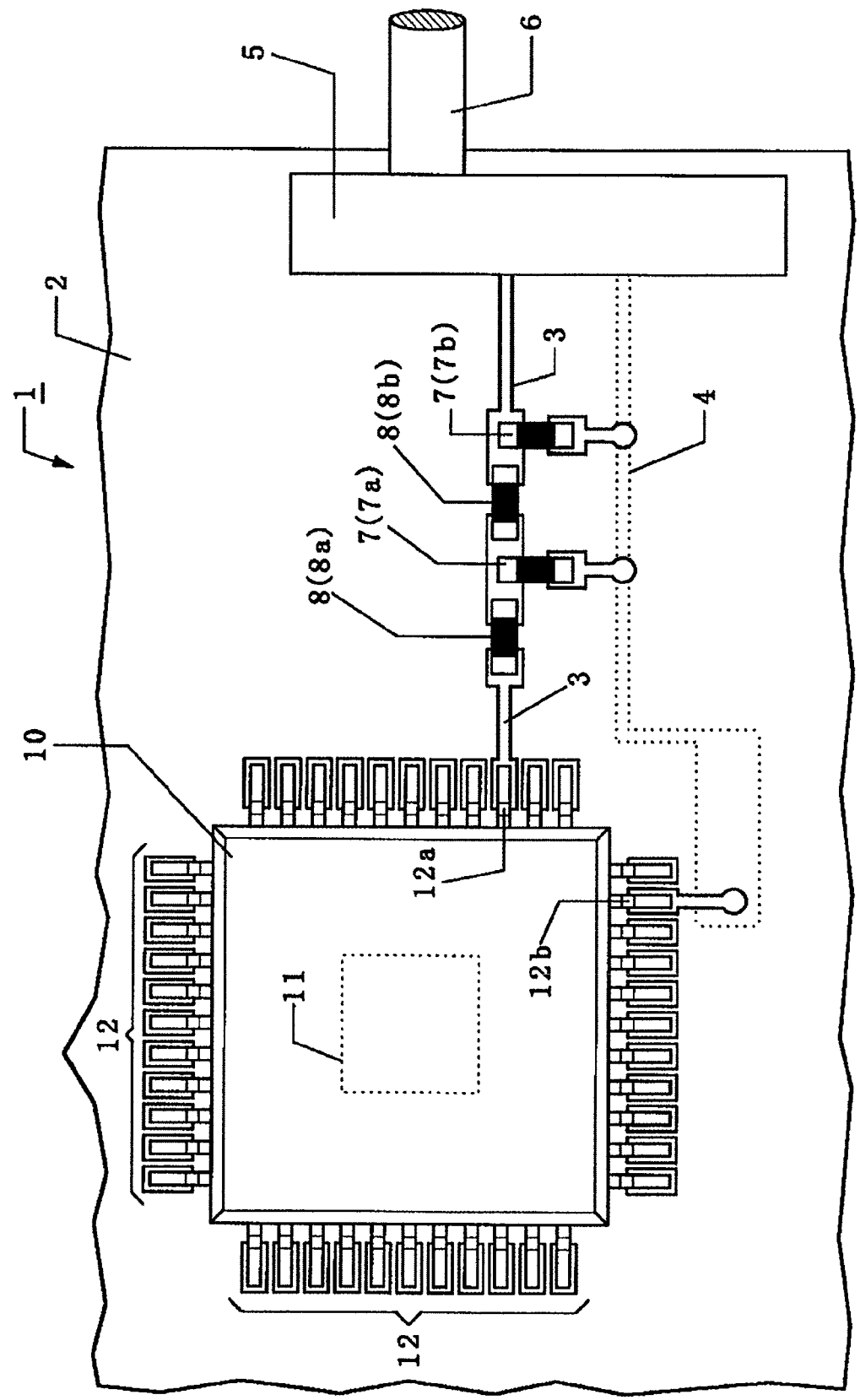
FIG. 4 is a plan view showing a schematic structure of an electronic device as a third embodiment according to the present invention.

FIG. 4 is a plan view showing a schematic structure of an electronic device as a third embodiment according to the present invention.

In the first embodiment described above, an example where the inductor element 8 for correcting the impedance error of the power-supply/GND wirings is equipped between the power-supply terminal of the microcomputer 10 and capacitor element 7 has been described. Meanwhile, as shown in FIG. 4, a set of an inductor element 8a and a capacitor element 7a and a set of an inductor element 8b and a capacitor element 7b that correspond to different resonance frequencies may be inserted and loaded so as to widen the frequency band where the effect to reduce the common mode current. For example, the set of the inductor element 8a and the capacitor element 7a is for 48 MHz, and the set of the inductor element 8b and the capacitor element 7b is for 80 MHz.

In this manner, the inductance element 8 and the capacitor element 7 for correcting impedance error of the power-supply/GND wirings have high common mode current reduction effect limited to around the resonance frequency. Therefore, by adding the set of inductance element 8 and the capacitor element 7 of different resonance frequencies, it is possible to obtain effects with respect to a wide frequency range.

Fourth Embodiment

Figure 5:
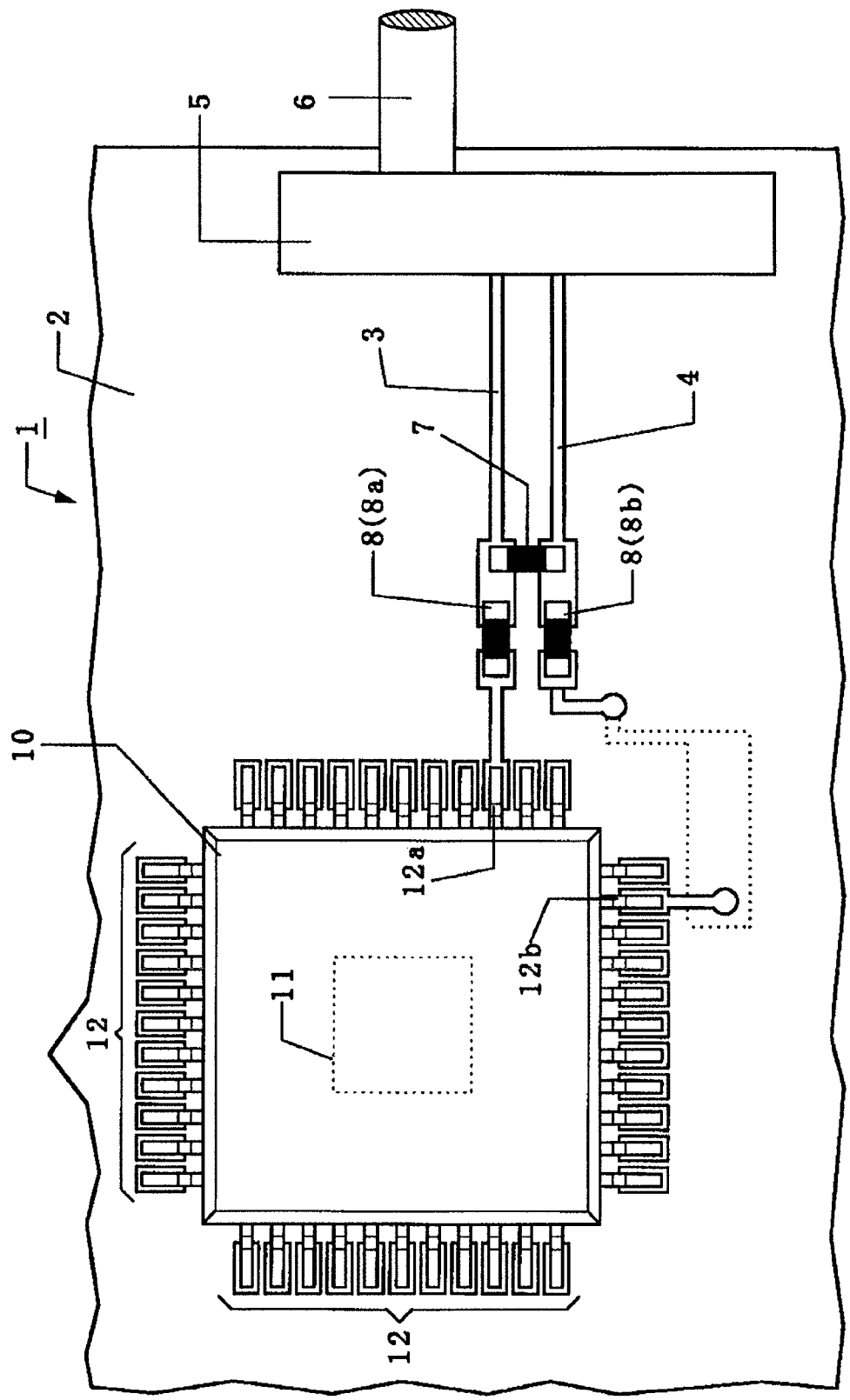
FIG. 5 is a plan view showing a schematic structure of an electronic device as a fourth embodiment according to the present invention.

FIG. 5 is a plan view showing a schematic structure of an electronic device as a fourth embodiment according to the present invention.

In the first embodiment described above, explanations have been made with the example where the inductor element 8 is connected in series to the power-supply wiring 3 whose wiring length is shorter, and the impedance error of the power-supply/GND wirings is corrected. Meanwhile, as shown in FIG. 5, the inductor element 8a may be connected in series to the power-supply wiring 3, and an inductor element 8b may be also connected in series to the GND wiring 4 whose wiring length is longer than the power-supply wiring, and thereby correcting the impedance error of the power-supply/GND wirings. Also in this case, it is possible to obtain the same effect as in the first embodiment described above.

Fifth Embodiment

Figure 6:
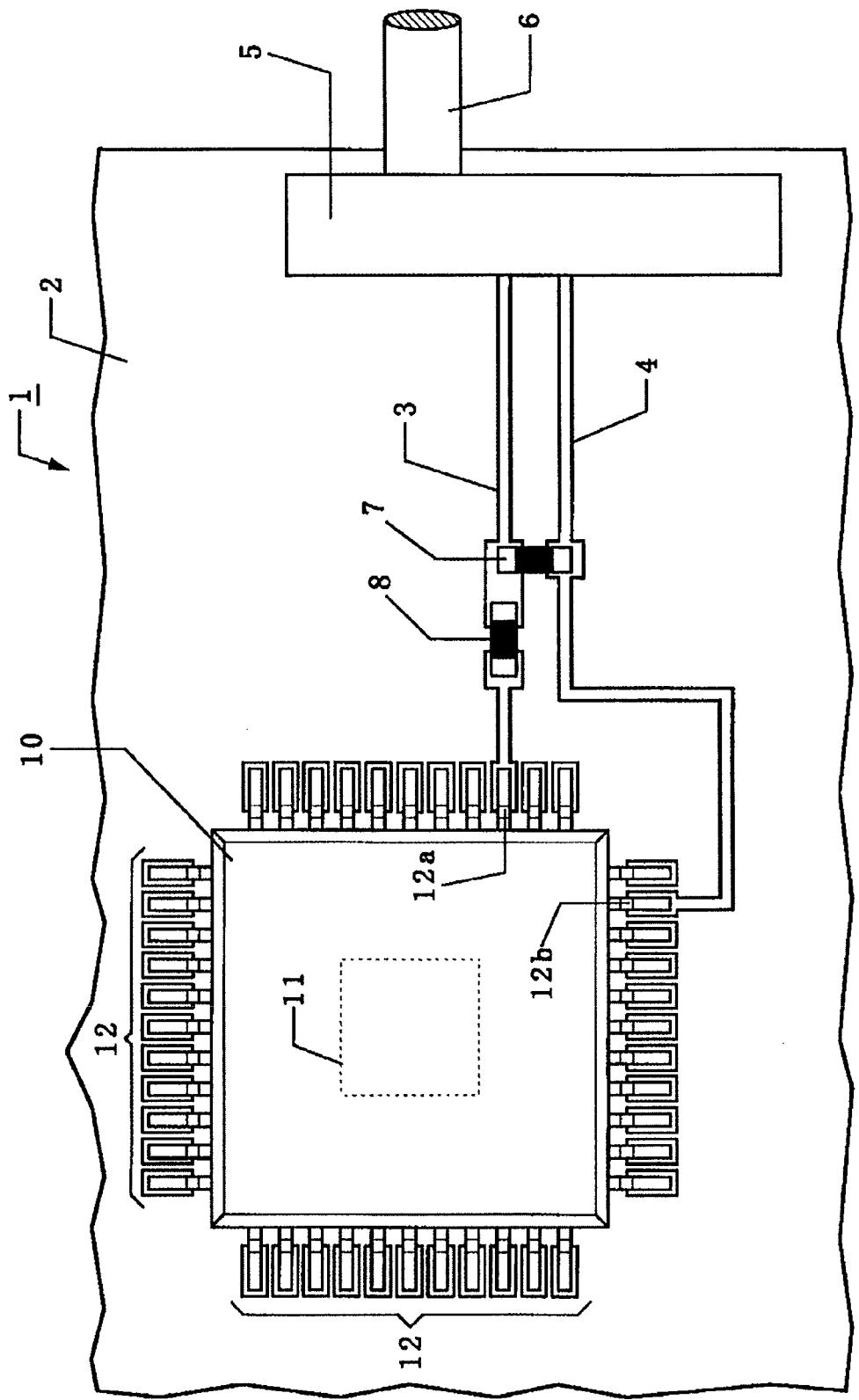
FIG. 6 is a plan view showing a schematic structure of an electronic device as a fifth embodiment according to the present invention.
Figure 7:
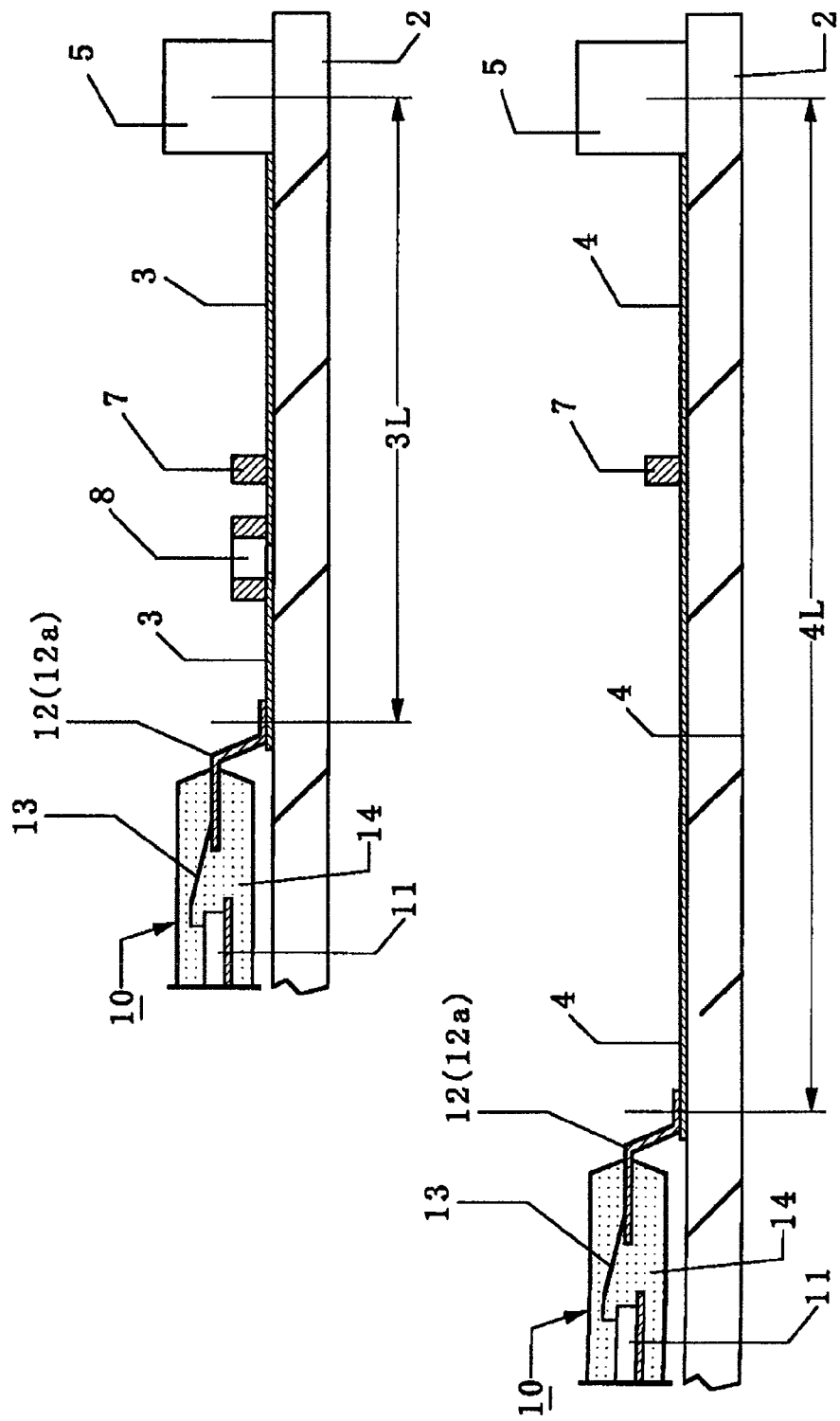
FIG. 7 is a cross sectional view showing schematic structures of the electronic device in FIG. 6 (FIG. 7A is a cross sectional view along a power-supply wiring, and FIG. 7B is a cross sectional view along a GND wiring)

FIG. 6 and FIG. 7 are figures of an electronic device as a fifth embodiment according to the present invention, and FIG. 6 is a plan view showing the electronic device, and FIG. 7 is a cross sectional view showing the electronic device (FIG. 7A is a cross sectional view along a power-supply wiring, and FIG. 7B is a cross sectional view along a GND wiring).

In the first embodiment described above, explanations have been made on the printed-circuit substrate 2 where the power-supply wiring 3 is formed in the first wiring layer on the main surface side, and the GND wiring 4 is formed in the first wiring layer on the main surface side, the second wiring layer on the back surface side, and the conductive layer of connection hole. Meanwhile, as shown in FIG. 6 and FIG. 7, the present invention may be applied to the wiring substrate 2 where the power-supply wiring 3 and the GND wiring 4 are formed in the first wiring layer of the main surface side, that is, they are formed in the same layer. Also in this case, it is possible to obtain the same effect as in the first embodiment described above.

Note that, in the first, second, third, and fifth embodiments described above, the inductor element 8 is connected in series to the power-supply wiring 3 whose wiring length is shorter so as to correct the impedance error of power-supply/GND wirings. Meanwhile, in the case where the wiring length of the GND wiring is shorter, the inductor element 8 may be connected in series to the GND wiring 4 so as to correct the impedance error of the power-supply/GND wirings.

Furthermore, in the first through fifth embodiments described above, as the inductor element 8, a rectangular surface-equipped type having electrodes at both ends is used but the inductor element 8 is not limited to the surface-equipped type and other inductor elements, for example, one having a structure of the coil type where a conductive wire is wound spirally may be employed.

Sixth Embodiment

Figure 8:
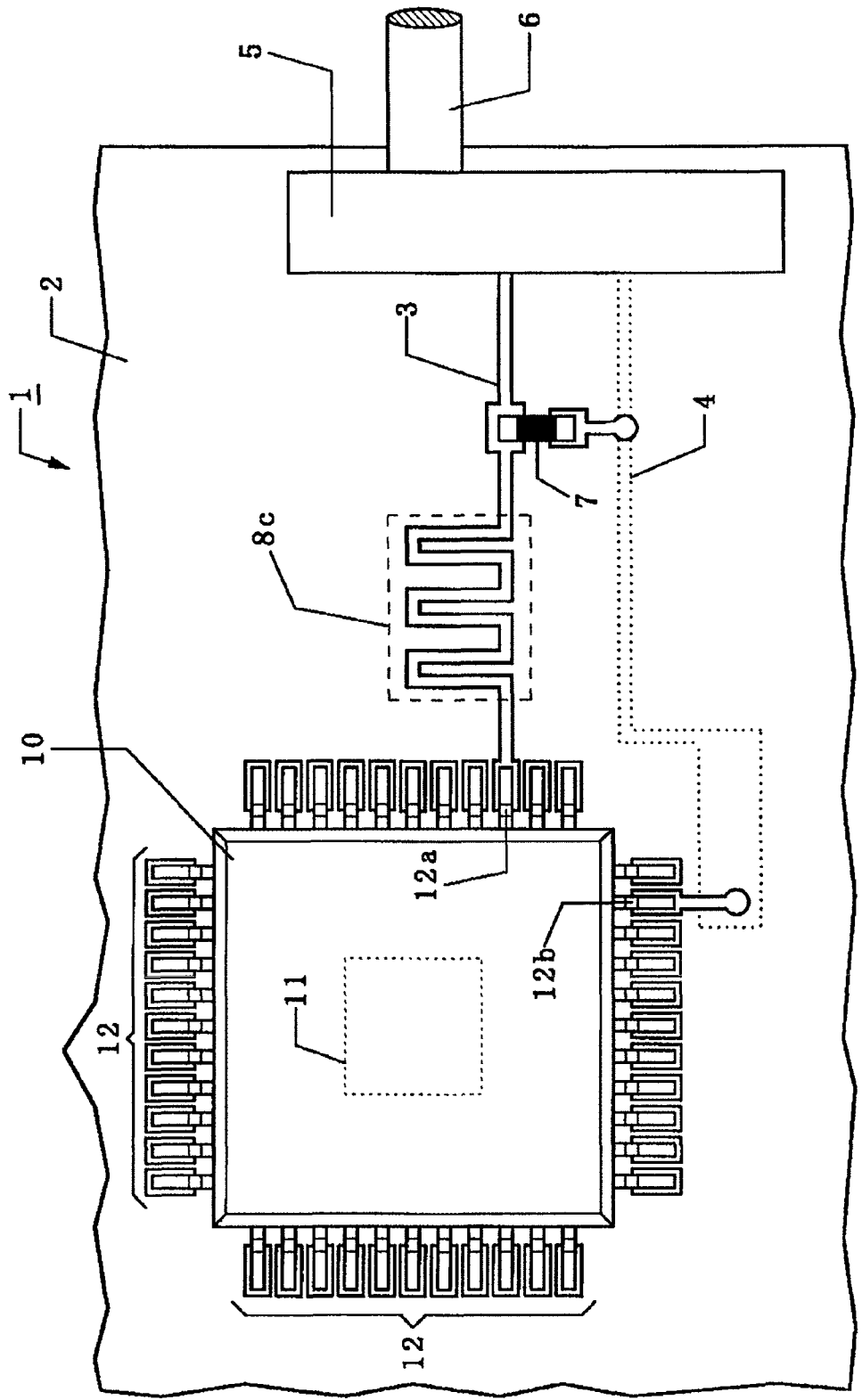
FIG. 8 is a plan view showing a schematic structure of an electronic device as a sixth embodiment according to the present invention.

FIG. 8 is a plan view showing a schematic structure of an electronic device as a sixth embodiment according to the present invention.

In the first through fifth embodiments described above, explanations have been made with the example where the inductor element 8 which is a discrete component is equipped and the impedance error of the power-supply/GND wirings is corrected. Meanwhile, as shown in FIG. 8, the impedance error of the power-supply/GND wirings may be corrected by an inductor 8c where a part of the power-supply wiring 3 is meander-crossed. Herein, meander-crossed means a pattern where a continuous wiring is drawn so as to have portions neighboring each other.

In the sixth embodiment, the inductance 8c is arranged in the power-supply wiring 3 but the present invention is not limited to this, and the inductor 8c may be arranged in the GND wiring 4 so as to correct the impedance error of power-supply/GND wirings.

Seventh Embodiment

Figure 9:
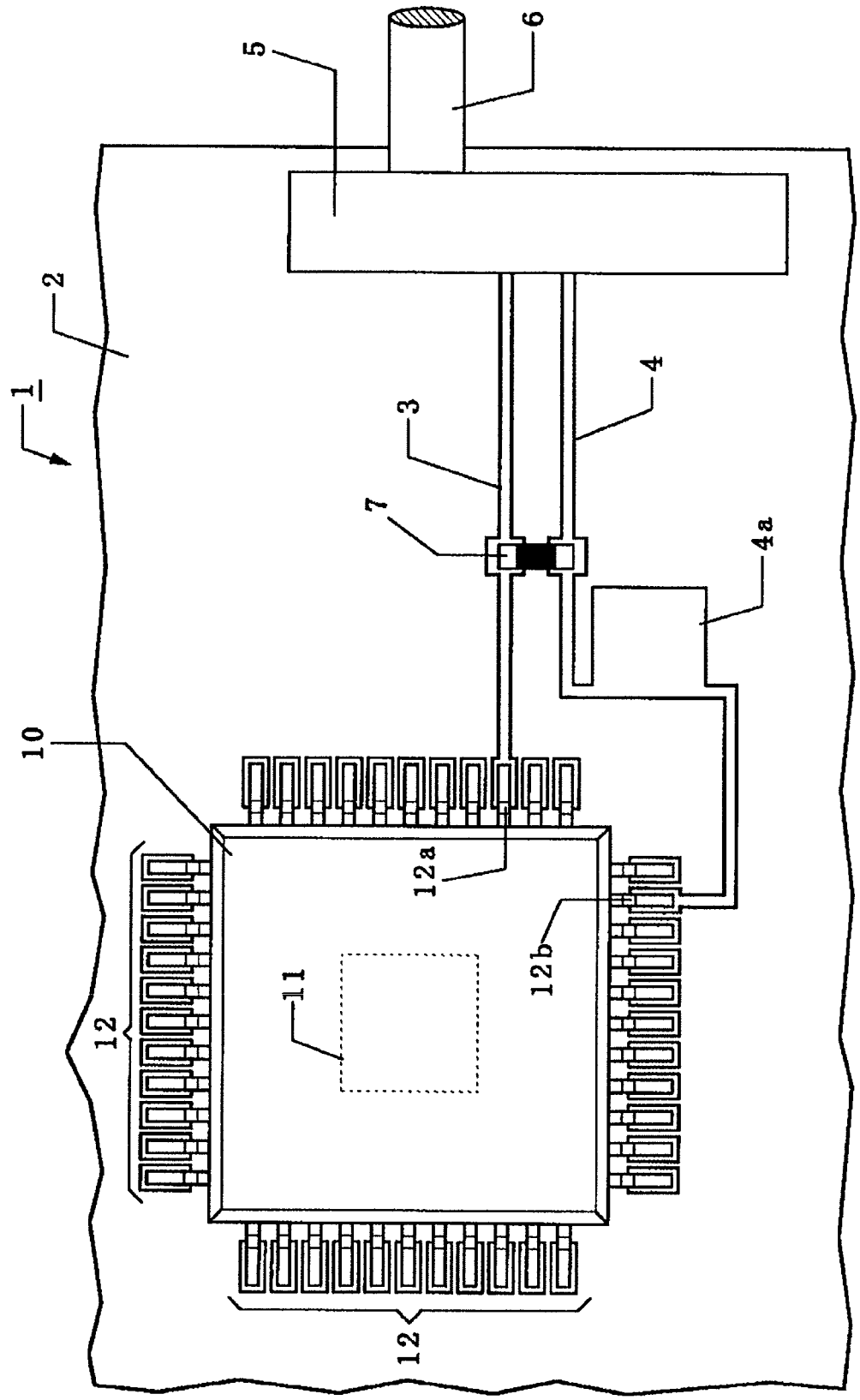
FIG. 9 is a plan view showing a schematic structure of an electronic device as a seventh embodiment according to the present invention.
Figure 10:
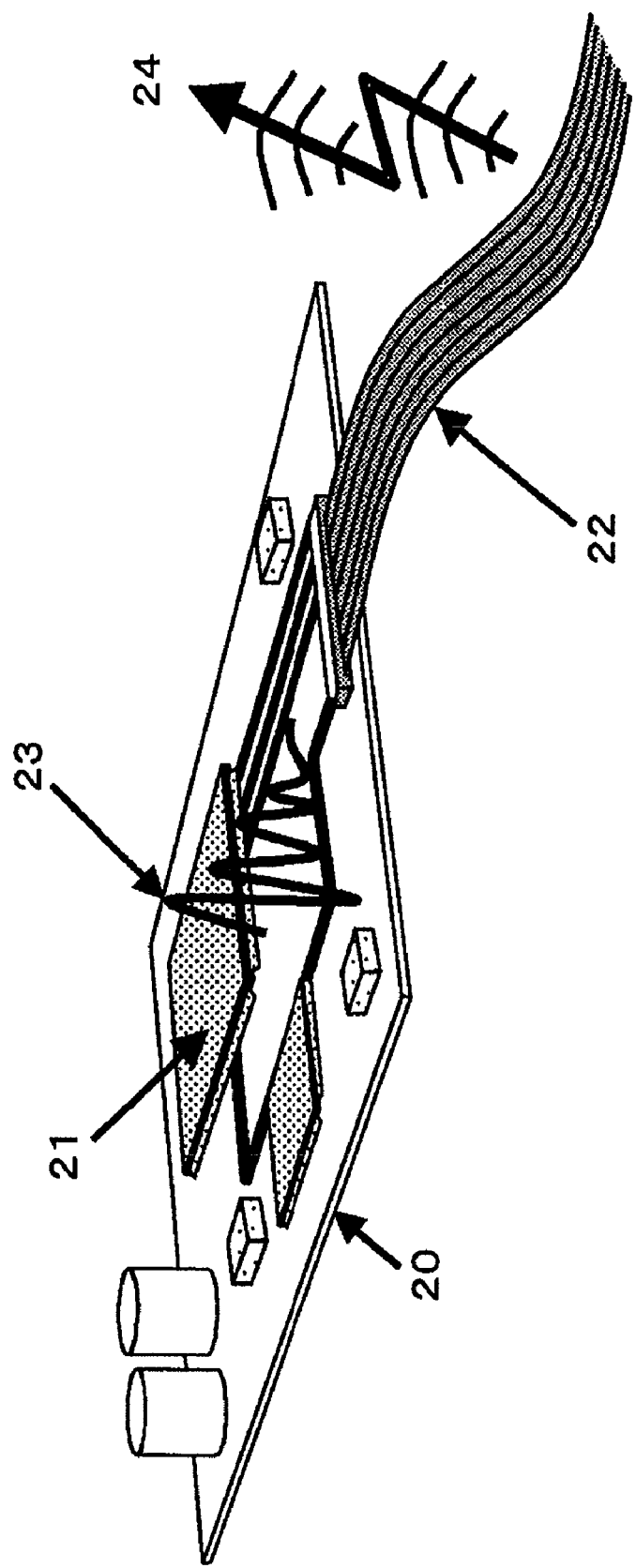
FIG. 10 is a diagram concerning unnecessary electromagnetic radiation that the inventors of the present invention have studied, and a schematic view showing occurrence of unnecessary electromagnetic radiation from an electronic device loading a microcomputer.
Figure 11:
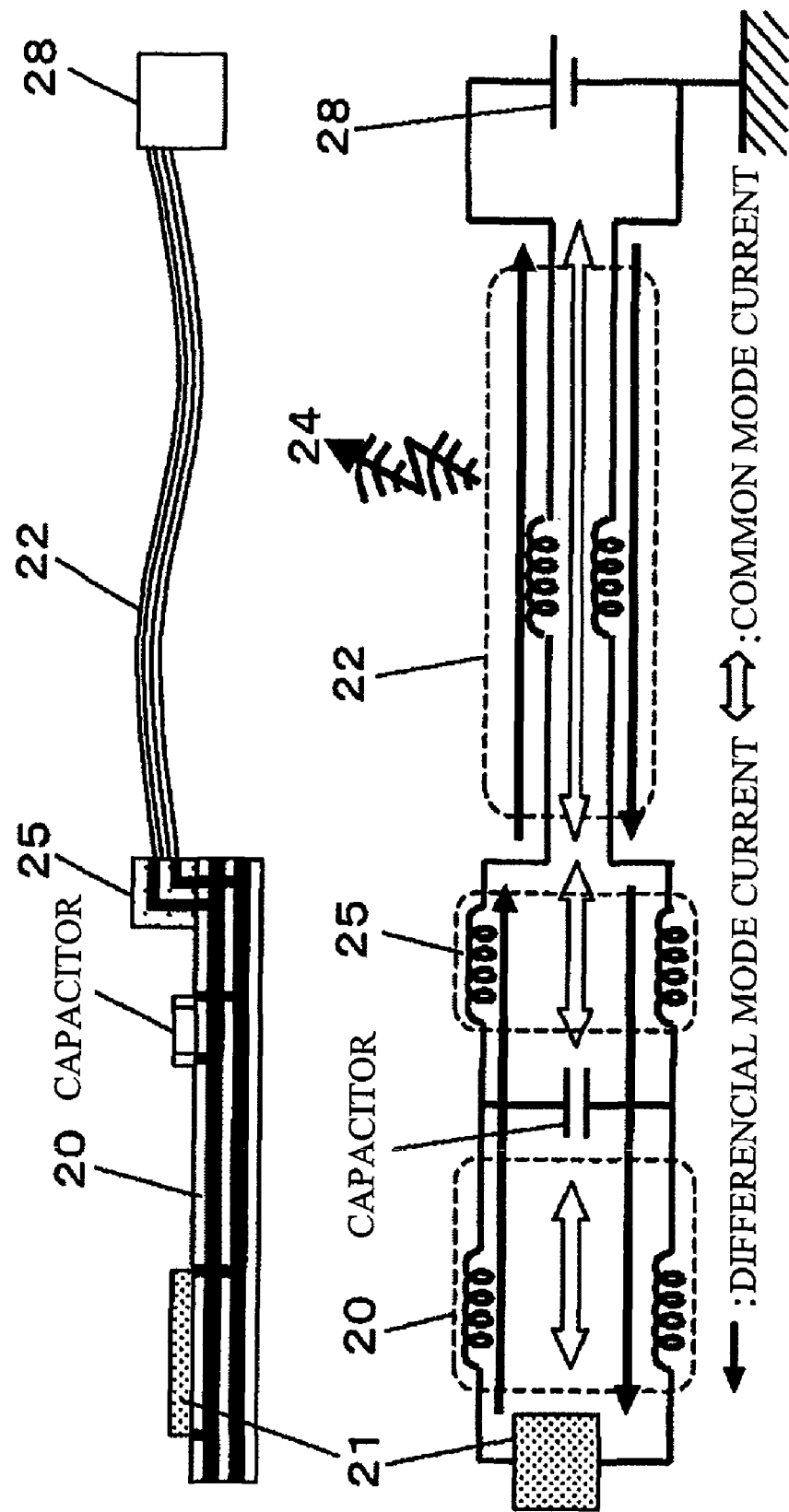
FIG. 11 is a diagram concerning unnecessary electromagnetic radiation that the inventors of the present invention have studied, and a schematic view showing occurrence mechanism of unnecessary electromagnetic radiation from an electronic device.
Figure 12A:
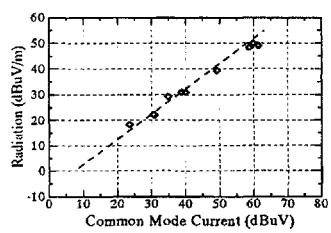
FIGS. 12A-12F are diagrams concerning unnecessary electromagnetic radiation that the inventors of the present invention have studied showing actual measurement values of common mode current and radiation noise amount.
Figure 12B:
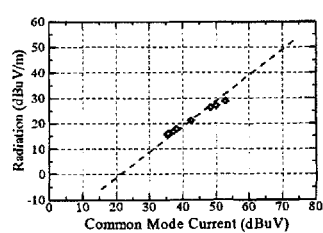
Figure 12C:
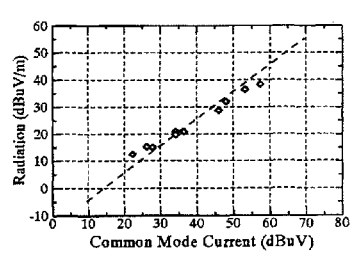
Figure 12D:
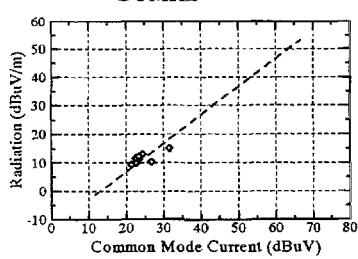
Figure 12E:
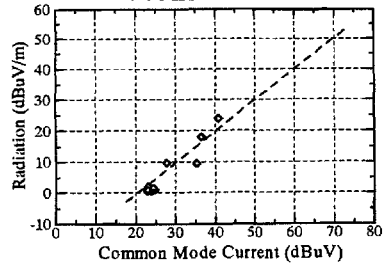
Figure 12F:
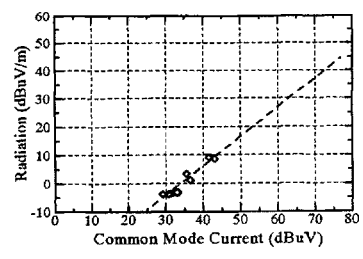
Figure 13:
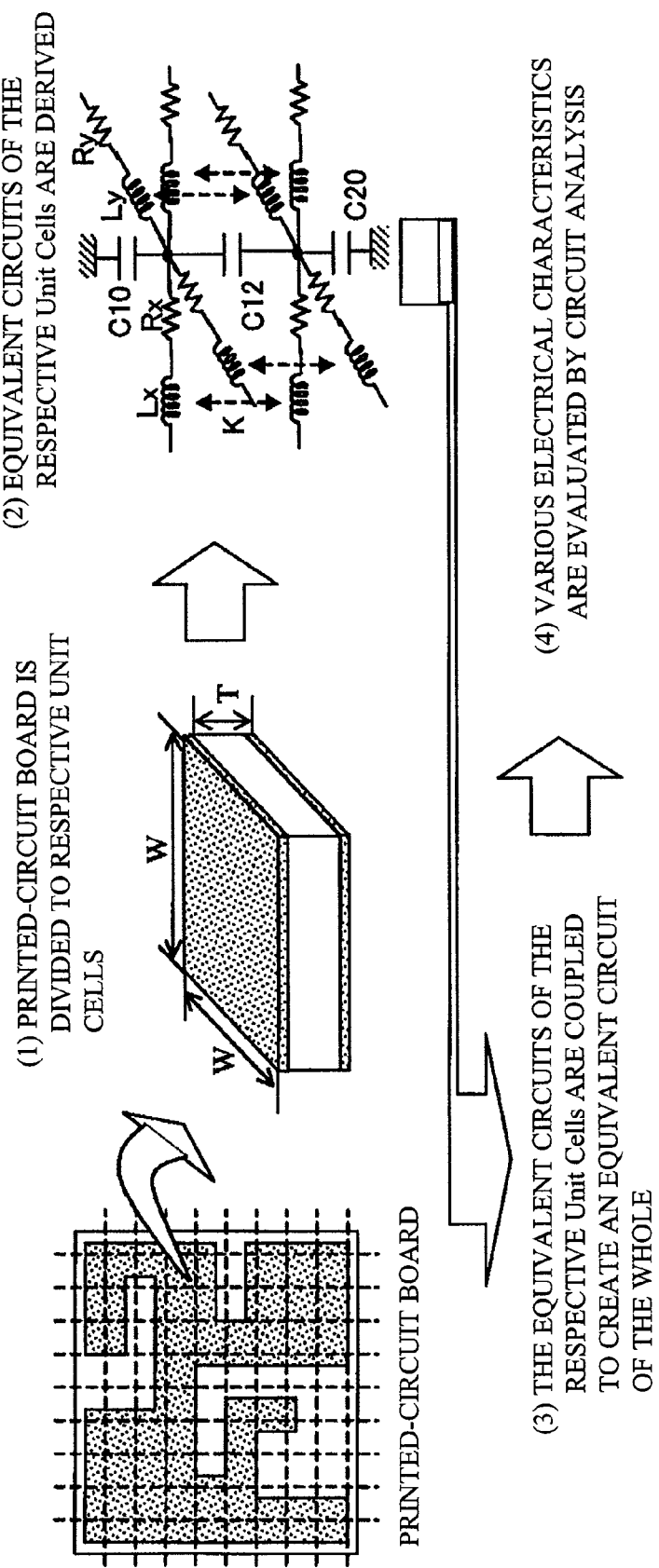
FIG. 13 is a diagram concerning unnecessary electromagnetic radiation that the inventors of the present invention have studied, and a conceptual diagram of a printed-circuit substrate modeling by the PEEC method.

FIG. 9 is a plan view showing a schematic structure of an electronic device as a seventh embodiment according to the present invention.

Moreover, in the first through fifth embodiments described above, explanations have been made with the example where the inductor element 8 is inserted into either of the power-supply/GND wirings having a lower impedance to correct the impedance error of the power-supply/GND wirings. Meanwhile, as shown in FIG. 9, a wide pattern 4a having a ground capacitance may be arranged in one having a higher impedance so as to correct the impedance error of the power-supply/GND wirings.

INDUSTRIAL APPLICABILITY

The present invention is effective to an electronic apparatus (electronic device) loading a microcomputer, in particular to an electronic device to be loaded in vehicles.

The invention claimed is:
1. An electronic device comprising:
a wiring substrate including a first power-supply wiring to which a first power-supply potential is applied, and a second power-supply wiring to which a second power-supply potential is applied,
wherein the second power-supply potential is smaller than the first power-supply potential;
a microcomputer including a first power-supply terminal connected with the first power-supply wiring, and a second power-supply terminal connected with the second power-supply terminal;
a connector connected with the first and second power-supply wirings; and
a bypass capacitor including a first electrode electrically connected with the first power-supply wiring, and a second electrode electrically connected with the second power-supply wiring;
wherein a length of the first power-supply wiring from the first power-supply terminal of the microcomputer to the connector is different from a length of the second power-supply wiring from the second power-supply terminal of the microcomputer to the connector;
wherein an inductor element is connected in series to one of the first and second power-supply wirings having the length from the microcomputer to the connector which is smaller than another;
wherein the inductor element is connected in between the microcomputer and the bypass capacitor; and
wherein in between the microcomputer and the inductor element, a bypass capacitor for preventing a noise is not connected in parallel to the first and second power-supply wirings.

2. The electronic device according to claim 1, wherein a length from the microcomputer to the bypass capacitor in one of the first and second power-supply wirings to which the inductor element is connected is shorter than a length from the microcomputer to the bypass capacitor in the other of the first and second power-supply wirings.

3. The electronic device according to claim 1, wherein a plurality of the inductor elements is connected to one of the first and second power-supply wirings having the length from the microcomputer to the connector which is smaller than another.

4. The electronic device according to claim 3, wherein a length from the microcomputer to the bypass capacitor in one of the first and second power-supply wirings to which the inductor element is connected is shorter than a length from the microcomputer to the bypass capacitor in the other of the first and second power-supply wirings.

5. The electronic device according to claim 1, wherein the length of the first power-supply wiring from the microcomputer to the connector is smaller than that of the second power-supply wiring from the microcomputer to the connector; and
wherein the inductor element is connected with the first power-supply wiring.

6. The electronic device according to claim 1, wherein the first power-supply wiring is formed in a first layer of the wiring substrate different from a second layer in which the second power-supply wiring is formed.

7. The electronic device according to claim 1, wherein the first power-supply wiring is formed in a first layer of the wiring substrate, which is the same as a second layer in which the second power-supply wiring is formed.

8. An electronic device comprising:
a wiring substrate including a first power-supply wiring to which a first power-supply potential is applied, and a second power-supply wiring to which a second power-supply potential is applied,
  wherein the second power-supply potential is smaller than the first power-supply potential;
a microcomputer including a first power-supply terminal connected with the first power-supply wiring, and a second power-supply terminal connected with the second power-supply terminal;
a connector connected with the first and second power-supply wirings; and
a bypass capacitor including a first electrode electrically connected with the first power-supply wiring, and a second electrode electrically connected with the second power-supply wiring;
wherein a length of the first power-supply wiring from the first power-supply terminal of the microcomputer to the connector is different from a length of the second power-supply wiring from the second power-supply terminal of the microcomputer to the connector;
wherein an inductor is formed in one of the first and second power-supply wirings having the length from the microcomputer to the connector which is smaller than another by snaking a part of the one;
wherein the inductor is formed in between the microcomputer and the bypass capacitor; and
wherein in between the microcomputer and the inductor, a bypass capacitor for preventing a noise is not connected in parallel to the first and second power-supply wirings.

9. An electronic device comprising:
a wiring substrate including a first power-supply wiring to which a first power-supply potential is applied, and a second power-supply wiring to which a second power-supply potential is applied,
  wherein the second power-supply potential is smaller than the first power-supply potential;
a microcomputer including a first power-supply terminal connected with the first power-supply wiring, and a second power-supply terminal connected with the second power-supply terminal;
a connector connected with the first and second power-supply wirings; and
a bypass capacitor including a first electrode electrically connected with the first power-supply wiring, and a second electrode electrically connected with the second power-supply wiring;
wherein a length of the first power-supply wiring from the first power-supply terminal of the microcomputer to the connector is different from a length of the second power-supply wiring from the second power-supply terminal of the microcomputer to the connector;
wherein an inductor element is connected in series to one of the first and second power-supply wirings having a dimension from the microcomputer to the connector which is smaller than another;
wherein the inductor element is connected in between the microcomputer and the bypass capacitor; and
wherein in between the microcomputer and the inductor element, a bypass capacitor for preventing a noise is not connected in parallel to the first and second power-supply wirings.

* * * * *